(12) United States Patent
Higashi et al.

(10) Patent No.: US 10,844,485 B2
(45) Date of Patent: Nov. 24, 2020

(54) FLOW PASSAGE STRUCTURE AND PROCESSING APPARATUS

(71) Applicant: Kabushiki Kaisha Toshiba, Minato-ku (JP)

(72) Inventors: Shinya Higashi, Yokohama (JP); Takahiro Terada, Yokohama (JP); Takuya Matsuda, Yokohama (JP); Shiguma Kato, Yokohama (JP); Masayuki Tanaka, Yokohama (JP)

(73) Assignee: Kabushiki Kaisha Toshiba, Minato-ku (JP)

( * ) Notice: Subject to any disclaimer, the term of this patent is extended or adjusted under 35 U.S.C. 154(b) by 379 days.

(21) Appl. No.: 15/746,191

(22) PCT Filed: Jun. 26, 2017

(86) PCT No.: PCT/JP2017/023441
§ 371 (c)(1),
(2) Date: Jan. 19, 2018

(87) PCT Pub. No.: WO2018/030009
PCT Pub. Date: Feb. 15, 2018

(65) Prior Publication Data
US 2019/0271080 A1 Sep. 5, 2019

(30) Foreign Application Priority Data
Aug. 10, 2016 (JP) .................................. 2016-158166

(51) Int. Cl.
*C23C 16/455* (2006.01)
*H01L 21/31* (2006.01)
*C23C 16/54* (2006.01)

(52) U.S. Cl.
CPC ...... *C23C 16/45502* (2013.01); *C23C 16/455* (2013.01); *C23C 16/45559* (2013.01); *H01L 21/31* (2013.01); *C23C 16/54* (2013.01)

(58) Field of Classification Search
CPC . C23C 16/45502; C23C 16/455; C23C 16/54; H01L 21/31
See application file for complete search history.

(56) References Cited

U.S. PATENT DOCUMENTS

| 4,218,013 A | * | 8/1980 | Davison ............... B05B 7/12 137/889 |
| 5,935,337 A | * | 8/1999 | Takeuchi ........ C23C 16/45565 118/724 |

(Continued)

FOREIGN PATENT DOCUMENTS

| CN | 203184129 U | * | 9/2013 | ............... B05B 1/06 |
| JP | 8-291385 | | * | 11/1996 | ............. C23C 16/44 |

(Continued)

OTHER PUBLICATIONS

Xingdan, Zhu, et al., "An Experimental Investigation of Showerhead Film Cooling Performance on a Turbine Blade". Procedia Engineering 99 ( 2015 ) 634-645.*

(Continued)

*Primary Examiner* — Bret P Chen
(74) *Attorney, Agent, or Firm* — Oblon, McClelland, Maier & Neustadt, L.L.P.

(57) ABSTRACT

A fluid passage structure includes a housing and first wall portions. The housing includes an outer surface located at an end of a first direction and two passages separated from each other provided inside. Each of two passages includes at least one fluid chamber, openings that open to the outer surface, and branch paths that is coupled to the fluid chamber. The fluid chambers of the two passages are arranged alternately in the first direction. The branch paths include at least one of:

(Continued)

branch paths that couple at least one of the openings with one fluid chamber; and branch paths that couple one fluid chamber with another fluid chamber. The first wall portions are provided in the housing, face the fluid chamber, and are arranged in the first direction via the fluid chamber.

16 Claims, 16 Drawing Sheets

(56) References Cited

U.S. PATENT DOCUMENTS

| | | | |
|---|---|---|---|
| 6,086,677 A | 7/2000 | Umotoy et al. | |
| 6,354,518 B1* | 3/2002 | Gil | B05B 1/304 239/458 |
| 8,146,838 B2* | 4/2012 | Luettgen | B05B 1/1636 239/447 |
| 2001/0040099 A1* | 11/2001 | Pedersen | C25D 17/001 205/143 |
| 2002/0015855 A1* | 2/2002 | Sajoto | C23C 14/568 428/639 |
| 2003/0094713 A1 | 5/2003 | Sunder et al. | |
| 2009/0078329 A1* | 3/2009 | Minegishi | B81C 1/00071 138/177 |
| 2009/0165271 A1* | 7/2009 | Norimatsu | B41J 2/14233 29/25.35 |
| 2009/0209945 A1* | 8/2009 | Lobl | A61M 5/14224 604/891.1 |
| 2011/0265887 A1 | 11/2011 | Lee et al. | |
| 2012/0164776 A1* | 6/2012 | Rathweg | C23C 14/0629 438/57 |
| 2013/0068161 A1 | 3/2013 | White et al. | |
| 2016/0039121 A1* | 2/2016 | Jiang | A61M 39/08 604/151 |
| 2016/0208380 A1 | 7/2016 | White et al. | |
| 2016/0363041 A1* | 12/2016 | Moffat | F02F 7/0002 |
| 2017/0184086 A1* | 6/2017 | Scancarello | F04B 39/0284 |

FOREIGN PATENT DOCUMENTS

| | | | |
|---|---|---|---|
| JP | 2000-279801 A | 10/2000 | |
| JP | 2009-214192 * | 9/2009 | B26F 3/00 |
| JP | 4575640 B2 | 11/2010 | |
| JP | 2012-102409 A | 5/2012 | |
| JP | 2013-172153 A | 9/2013 | |
| JP | 2014-535001 A | 12/2014 | |
| JP | 5752238 B2 | 7/2015 | |

OTHER PUBLICATIONS

Kim, You-Jae, et al., "Effects of showerhead shapes on the flowfields in a RF-PECVD reactor". Surface & Coatings Technology 193 (2005) 88-93.*

International Search Report dated Sep. 19, 2017 in PCT/JP2017/023441 filed Jun. 26, 2017(with Translation of Category of Cited Documents in attached foreign language Search Report).

* cited by examiner

US 10,844,485 B2

FLOW PASSAGE STRUCTURE AND PROCESSING APPARATUS

CROSS-REFERENCE TO RELATED APPLICATIONS

This application is a national stage application of International Application No. PCT/JP2017/023441, filed on Jun. 26, 2017, which designates the United States, incorporated herein by reference, and which is based upon and claims the benefit of priority from Japanese Patent Application No. 2016-158166, filed on Aug. 10, 2016, the entire contents of each of which are incorporated herein by reference.

FIELD

Embodiments described herein relate generally to a to a flow passage structure and a processing apparatus.

BACKGROUND

In an apparatus that suctions or discharges fluid from a plurality of openings, a member that suctions or discharges a plurality of types of fluid has been known. For example, the fluid of multiple types is diffused by each of a plurality of passages formed by the member and is discharged from the openings.

DETAILED DESCRIPTION

According to an embodiment, a fluid passage structure according to one embodiment includes a housing and a plurality of first wall portions. The housing includes an outer surface located at an end of a first direction and two passages separated from each other provided inside. Each of the two passages includes at least one fluid chamber, a plurality of openings that open to the outer surface, and a plurality of branch paths that be coupled to the fluid chamber. The fluid chambers of the two passages are arranged alternately in the first direction. The branch paths include at least one of: a plurality of branch paths that couple at least one of the openings with one fluid chamber; and a plurality of branch paths that couple one fluid chamber with another fluid chamber. The first wall portions are provided in the housing, face the fluid chamber, and are arranged in the first direction via the fluid chamber.

The following describes a first embodiment with reference to FIGS. 1 to 8. In the present specification basically, it is defined that a vertically upward direction is an upper direction and a vertically downward direction is a lower direction. In the specification, on a constituent element according to embodiments and on the explanation of the element, it may be described in a plurality of expressions. The constituent element and the explanation for which various expressions are made may be expressed in other expressions not described. The constituent element and the explanation for which a plurality of expressions are not made may also be expressed in other expressions not described.

Figure 1:
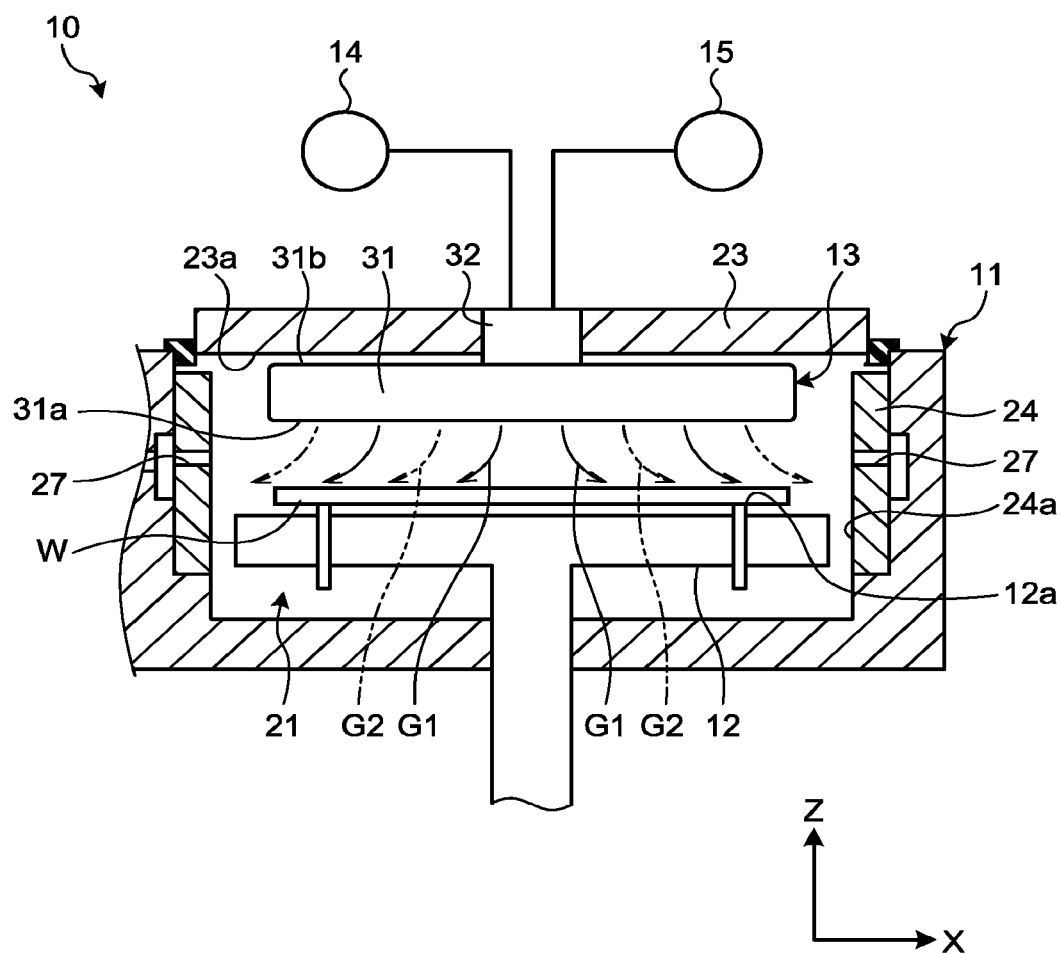
FIG. 1 is a cross-sectional view roughly illustrating a semiconductor manufacturing apparatus according to a first embodiment.

FIG. 1 is a cross-sectional view roughly illustrating a semiconductor manufacturing apparatus 10 according to the first embodiment. The semiconductor manufacturing apparatus 10 is one example of a processing apparatus and can also be referred to as a manufacturing apparatus, a processing apparatus, a suction and discharge apparatus, a feeding apparatus, or an apparatus. The processing apparatus is not limited to the semiconductor manufacturing apparatus 10, and may be other apparatuses that perform processing, such as processing, cleansing, and test, on an object of the processing.

As indicated in the drawings, in the present specification, an X axis, a Y axis, and a Z axis are defined. The X axis, the Y axis, and the Z axis are orthogonal to one another. The X axis lies along the width of the semiconductor manufacturing apparatus 10. The Y axis lies along the depth (length) of the semiconductor manufacturing apparatus 10. The Z axis lies along the height of the semiconductor manufacturing apparatus 10. In the first embodiment, the Z axis extends in the vertical direction. The direction that the Z axis extends and the vertical direction may be different.

The semiconductor manufacturing apparatus 10 of the first embodiment illustrated in FIG. 1 is a chemical vapor deposition (CVD) apparatus, for example. The semiconductor manufacturing apparatus 10 may be other apparatuses. The semiconductor manufacturing apparatus 10 includes a manufacturing unit 11, a stage 12, a shower plate 13, a first pump 14, and a second pump 15.

The manufacturing unit 11 can also be referred to as a housing, for example. The stage 12 can also be referred to as a placing portion or a pedestal, for example. The shower plate 13 is one example of a fluid passage structure and a housing, and can also be referred to as a branching unit, a discharge unit, an ejection unit, a suction unit, a member, or a component, for example. In the first embodiment, the shower plate 13 discharges fluid. The fluid passage structure, however, may suction fluid.

The first pump 14 is one example of a first fluid feeding unit. The second pump 15 is one example of a second fluid feeding unit. The first pump 14 and the second pump 15 can also be referred to as a feeding unit, an ejection unit, or a sending unit, for example.

Inside the manufacturing unit 11, provided is a hermetically sealable air-tight chamber 21. The chamber 21 can also be referred to as a room or a space, for example. The semiconductor manufacturing apparatus 10 manufactures a semiconductor wafer (hereinafter referred to as a wafer) W in the chamber 21, for example. The wafer W is one example of an object. The manufacturing unit 11 includes an upper wall 23 and a circumferential wall 24.

The upper wall 23 includes an inner surface 23a. The inner surface 23a is a substantially flat surface facing in the lower direction. The inner surface 23a forms a part of the chamber 21. That is, the inner surface 23a faces the inside of the chamber 21.

The circumferential wall 24 includes an inner circumferential surface 24a. The inner circumferential surface 24a is a surface facing in a substantially horizontal direction. The inner circumferential surface 24a forms a part of the chamber 21. That is, the inner circumferential surface 24a faces the inside of the chamber 21. On the circumferential wall 24, a plurality of exhaust ports 27 are provided. From the exhaust ports 27, the gas of the chamber 21 can be suctioned.

The stage 12 and the shower plate 13 are arranged in the chamber 21. As illustrated in FIG. 1, a part of the stage 12 and a part of the shower plate 13 may be located outside the chamber 21.

The stage 12 includes a supporting portion 12a. The supporting portion 12a is one example of an object supporting portion. The supporting portion 12a is located in the chamber 21, faces the inner surface 23a of the upper wall 23, and supports the wafer W. The stage 12 includes a heater and can heat up the wafer W supported by the supporting portion 12a.

The stage 12 can, by suctioning the wafer W, fix the wafer W onto the supporting portion 12a, for example. The stage 12 may further be rotatable in a state of supporting the wafer W.

The shower plate 13 includes a diffusion portion 31 and a tube portion 32. The diffusion portion 31 is formed in a substantially disc-like shape expanding on an X-Y plane. The tube portion 32 extends in a positive direction along the Z axis (direction the Z axis arrow faces, upper direction) from the substantially central portion of the diffusion portion 31.

The tube portion 32 runs through the upper wall 23. For example, as the tube portion 32 is secured to the upper wall 23, the shower plate 13 is fitted to the upper wall 23 of the manufacturing unit 11. The shower plate 13 may be fitted to the manufacturing unit 11 by other means.

The diffusion portion 31 includes a bottom surface 31a and an upper surface 31b. The bottom surface 31a is one example of an outer surface and can also be referred to as a surface, for example. The bottom surface 31a is located at the end of a negative direction along the Z axis of the shower plate 13 (direction opposite to the direction the Z axis arrow faces, lower direction), and is formed substantially flat. The negative direction along the Z axis is one example of a first direction. The bottom surface 31a faces the negative direction along the Z axis. The bottom surface 31a may be a curved surface or may have irregularities.

The bottom surface 31a of the diffusion portion 31 faces the wafer W supported by the supporting portion 12a of the stage 12. In other words, the stage 12 supports the wafer W at the location to which the bottom surface 31a of the diffusion portion 31 faces.

The upper surface 31b of the diffusion portion 31 is located on the opposite side of the bottom surface 31a. The upper surface 31b is formed substantially flat and faces the positive direction along the Z axis. The upper surface 31b may be a curved surface or may have irregularities. The tube portion 32 extends in the positive direction along the Z axis from the upper surface 31b.

Figure 2:
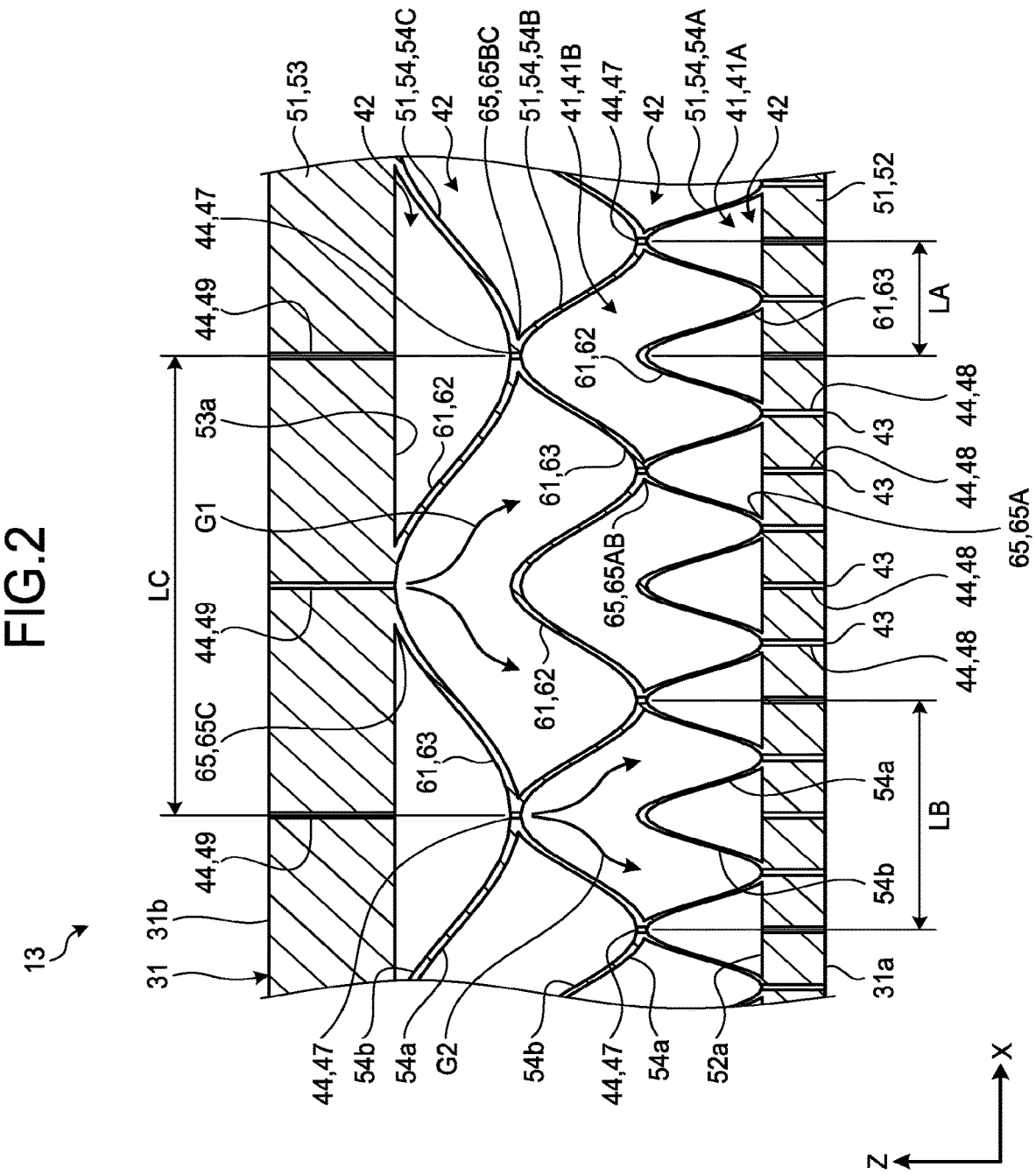
FIG. 2 is a cross-sectional view illustrating a part of a diffusion portion in the first embodiment.

FIG. 2 is a cross-sectional view illustrating a part of the diffusion portion 31 of the first embodiment. As illustrated in FIG. 2, in the diffusion portion 31, two passages 41 are provided. Each of the two passages 41 can also be referred to as a space, a room, or a flow passage, for example.

For the sake of explanation, the two passages 41 may individually be referred to as a passage 41A and a passage 41B. The explanation common to the passage 41A and the passage 41B is described as the explanation on the passage 41.

Each of the two passages 41 is provided inside the shower plate 13. The two passages 41 are independent of each other. In other words, the passage 41A is separated from the passage 41B and the passage 41B is separated from the passage 41A.

Each of the two passages 41 includes a plurality of fluid chambers 42, a plurality of outlets 43, and a plurality of branch paths 44. The fluid chamber 42 can also be referred to as a room, a flow passage, or a space, for example. The outlet 43 is one example of an opening, and can also be referred to as an open end, an end portion, an edge, or a hole, for example. The branch path 44 can also be referred to as a branch, a pore, an opening, or a flow passage, for example.

The fluid chambers 42 of the respective passages 41 are arranged being spaced apart in the negative direction along the Z axis. The respective fluid chambers 42 of the two passages 41 are arranged alternately in the negative direction along the Z axis. For example, one fluid chamber 42 of the passage 41A is, in the negative direction along the Z axis, located between two fluid chambers 42 of the passage 41B. Furthermore, one fluid chamber 42 of the passage 41B is, in the negative direction along the Z axis, located between two fluid chambers 42 of the passage 41A.

In one passage 41, a part of one fluid chamber 42 and a part of the other fluid chamber 42 may be adjacent in the negative direction along the Z axis. In the negative direction along the Z axis, between a part of one fluid chamber 42 and a part of the other fluid chamber 42 of one passage 41, if one fluid chamber 42 of the other passage 41 is located, it can be said that the respective fluid chambers 42 of the two passages 41 are arranged alternately in the negative direction along the Z axis.

The outlets 43 open to the bottom surface 31a of the diffusion portion 31. The outlets 43 are provided at the ends of several branch paths 44. With different wording, the outlets 43 are formed by the edges of the bottom surface 31a located at the ends of the several branch paths 44.

Figure 3:
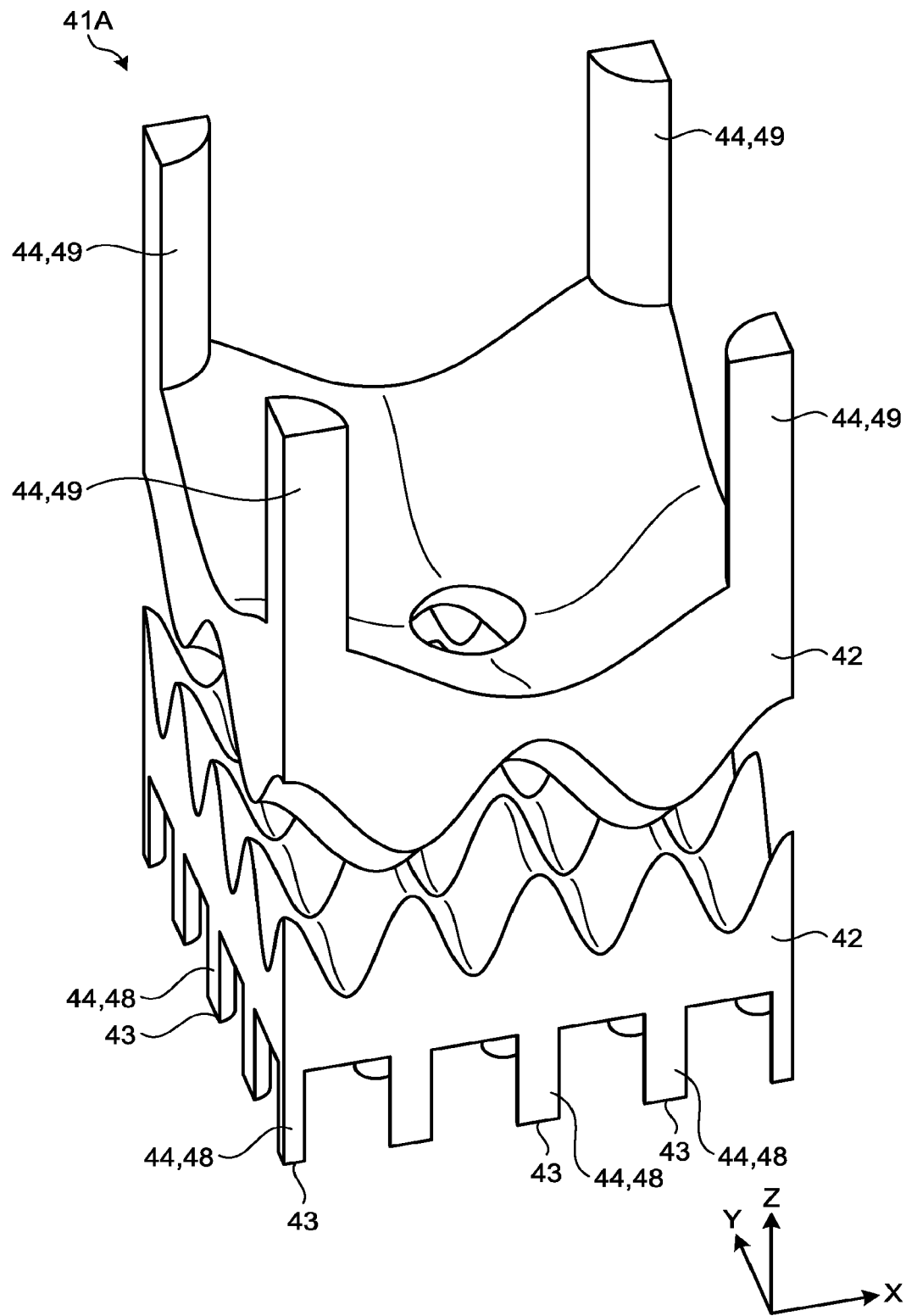
FIG. 3 is a perspective view illustrating a part of one of passages in the first embodiment.
Figure 4:
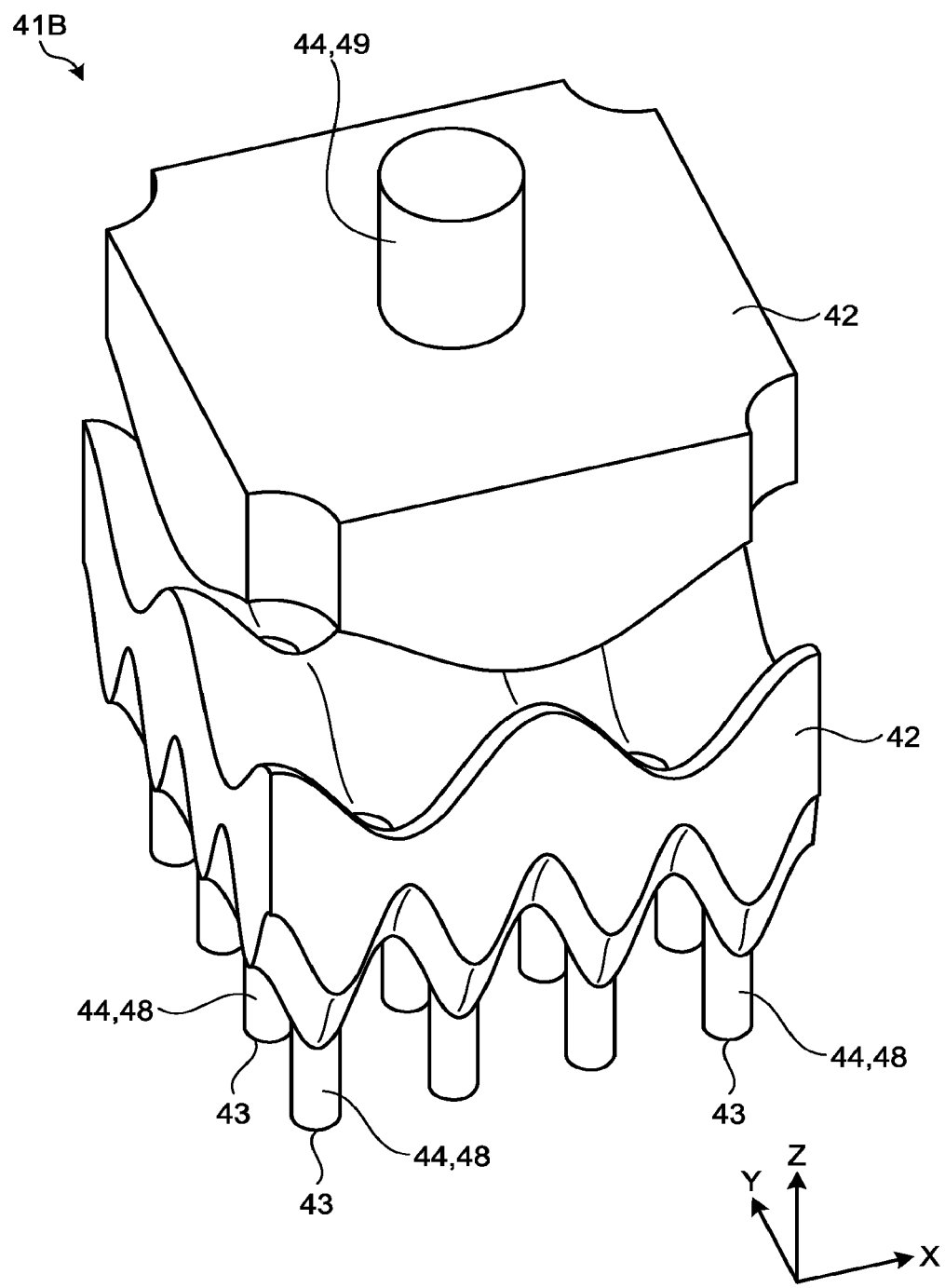
FIG. 4 is a perspective view illustrating a part of the other of the passages in the first embodiment.

FIG. 3 is a perspective view illustrating a part of the passage 41A of the first embodiment. FIG. 3 illustrates the passage 41A omitting the diffusion portion 31. FIG. 4 is a perspective view illustrating a part of the passage 41B of the first embodiment. FIG. 4 illustrates the passage 41B omitting the diffusion portion 31.

As illustrated in FIGS. 3 and 4, in the first embodiment, the outlets 43 are arranged at equal intervals in the direction along the X axis and the direction along the Y axis. In other words, the outlets 43 are arranged in a matrix form. The outlets 43 may be in other arrangement.

As illustrated in FIG. 2, each of the branch paths 44 is coupled to at least one fluid chamber 42. The branch paths 44, in the first embodiment, include a plurality of connecting channels 47, a plurality of outflow channels 48, and a plurality of inflow channels 49.

Each of the connecting channels 47 is the branch path 44 that couples one fluid chamber 42 with the other fluid chamber 42. Two fluid chambers 42 coupled by the connecting channel 47 of one passage 41 are, in the negative direction along the Z axis, adjacent in the negative direction along the Z axis via one fluid chamber 42 of the other passage 41.

Each of the outflow channels 48 is the branch path 44 that couples at least one of the outlets 43 with one fluid chamber 42. The fluid chamber 42 to which the outflow channel 48 of one passage 41 is coupled is, out of the fluid chambers 42 of the one passage 41, the fluid chamber 42 closest to the bottom surface 31a of the diffusion portion 31. The outlet 43 is provided at the end of the outflow channel 48.

Each of the inflow channels 49 is coupled to one fluid chamber 42. The fluid chamber 42 to which the inflow channel 49 of one passage 41 is coupled is, out of the fluid chambers 42 of the one passage 41, the fluid chamber 42 closest to the upper surface 31b of the diffusion portion 31.

In the diffusion portion 31, a plurality of walls 51 are provided. The walls 51 are one example of a first wall portion. The walls 51 include a bottom wall 52, an upper wall 53, and a plurality of partition walls 54. The bottom wall 52 and the upper wall 53 can also be referred to as an outer wall, for example. The partition wall 54 can also be referred to as a curved wall, an interposing portion, or a separation portion, for example.

The bottom wall 52, the upper wall 53, and the partition walls 54 are arranged in the negative direction along the Z axis via the fluid chambers 42. In the negative direction along the Z axis, the partition walls 54 are located between the upper wall 53 and the bottom wall 52.

For example, between the bottom wall 52 and one partition wall 54, one fluid chamber 42 of the passage 41A is present. Between the upper wall 53 and one partition wall 54, one fluid chamber 42 of the passage 41B is present. Between two adjacent partition walls 54, one fluid chamber 42 of the passage 41A or one fluid chamber 42 of the passage 41B is present.

The bottom wall 52 is formed in a substantially flat plate-like shape. The bottom wall 52 may be formed in other shapes. The bottom wall 52 includes the bottom surface 31a of the diffusion portion 31. That is, the bottom wall 52 is located furthest in the lower direction, out of the bottom wall 52, the upper wall 53, and the partition walls 54.

The bottom wall 52 further includes an inner surface 52a. The inner surface 52a is one example of a first surface. The inner surface 52a is located on the opposite side of the bottom surface 31a. The inner surface 52a is a substantially flat surface facing in the positive direction along the Z axis. The inner surface 52a may be formed in other shapes.

The upper wall 53 is formed in a substantially flat plate-like shape. The upper wall 53 may be formed in other shapes. The upper wall 53 includes the upper surface 31b of the diffusion portion 31. That is, the upper wall 53 is located furthest in the upper direction, out of the bottom wall 52, the upper wall 53, and the partition walls 54.

The upper wall 53 further includes an inner surface 53a. The inner surface 53a is one example of a second surface. The inner surface 53a is located on the opposite side of the upper surface 31b. The inner surface 53a is a substantially flat surface facing in the negative direction along the Z axis. The inner surface 53a may be formed in other shapes.

The partition walls 54 are provided inside the diffusion portion 31. In the first embodiment, each of the partition walls 54 is formed in a periodically curved plate-like shape. The partition wall 54 may be formed in other shapes. The partition walls 54 are overlapped in the negative direction along the Z axis.

Each of the partition walls 54 includes a lower surface 54a and an upper surface 54b. The lower surface 54a is one example of the second surface. The upper surface 54b is one example of the first surface. The upper surface 54b is located on the opposite side of the lower surface 54a. The upper surface 54b is located further in the positive direction along the Z axis than the lower surface 54a.

The bottom wall 52, the upper wall 53, and the partition walls 54 thus arranged each face at least one of the fluid chamber 42 of the passage 41A and the fluid chamber 42 of the passage 41B. For example, the inner surface 52a of the bottom wall 52 faces one fluid chamber 42 of the passage 41A. The inner surface 53a of the upper wall 53 faces one fluid chamber 42 of the passage 41B. The lower surface 54a and the upper surface 54b of the partition walls 54 each face one fluid chamber 42 of the passage 41A or one fluid chamber 42 of the passage 41B.

In the first embodiment, three partition walls 54 are provided inside the diffusion portion 31. For the sake of explanation, the three partition walls 54 may individually be referred to as partition walls 54A, 54B, and 54C. The explanation common to the partition walls 54A, 54B, and 54C is described as the explanation on the partition wall 54.

The partition wall 54B is, in the negative direction along the Z axis, located between the partition wall 54C and the partition wall 54A. The partition wall 54A is closer to the bottom wall 52 than the partition wall 54B. The partition wall 54C is closer to the upper wall 53 than the partition wall 54B.

Each of the partition walls 54 includes a plurality of curved portions 61. At least one of the bottom wall 52 and the upper wall 53 may further include a plurality of curved portions 61. The curved portions 61 include a plurality of convexly-curved portions 62 and a plurality of concavely-curved portions 63. The convexly-curved portion 62 is one example of a first curved portion and a third curved portion. The concavely-curved portion 63 is one example of a second curved portion.

The convexly-curved portion 62 is a part of the partition wall 54 and is a portion projecting in the positive direction along the Z axis. The positive direction along the Z axis is one example of a direction opposite to the first direction. The convexly-curved portion 62 is sunken so as to be away from the bottom wall 52, and is projecting toward the upper wall 53. In the convexly-curved portion 62, the lower surface 54a is sunken in the positive direction along the Z axis, and the upper surface 54b is projecting in the positive direction along the Z axis.

The convexly-curved portion 62 includes an apex portion and a peripheral portion of the apex portion. The apex portion is, out of the convexly-curved portion 62, a portion located furthest in the positive direction (upper direction)

along the Z axis. The peripheral portion of the apex portion is located further in the negative direction (lower direction) along the Z axis than the apex portion.

The convexly-curved portion 62 tapers toward the positive direction along the Z axis. In other words, the cross-sectional area of a space inside the convexly-curved portion 62 becomes smaller toward the positive direction along the Z axis. The convexly-curved portion 62 may have other shapes.

The concavely-curved portion 63 is a part of the partition wall 54 and is a portion projecting in the negative direction along the Z axis. The concavely-curved portion 63 is projecting toward the bottom wall 52, and is sunken so as to be away from the upper wall 53. In the concavely-curved portion 63, the lower surface 54a is projecting in the negative direction along the Z axis, and the upper surface 54b is sunken in the negative direction along the Z axis.

The concavely-curved portion 63 includes an apex portion and a peripheral portion of the apex portion. The apex portion is, out of the concavely-curved portion 63, a portion located furthest in the negative direction (lower direction) along the Z axis. The peripheral portion of the apex portion is located further in the positive direction (upper direction) along the Z axis than the apex portion.

The concavely-curved portion 63 tapers toward the negative direction along the Z axis. In other words, the cross-sectional area of a space inside the concavely-curved portion 63 becomes smaller toward the negative direction along the Z axis. The concavely-curved portion 63 may have other shapes.

Figure 5:
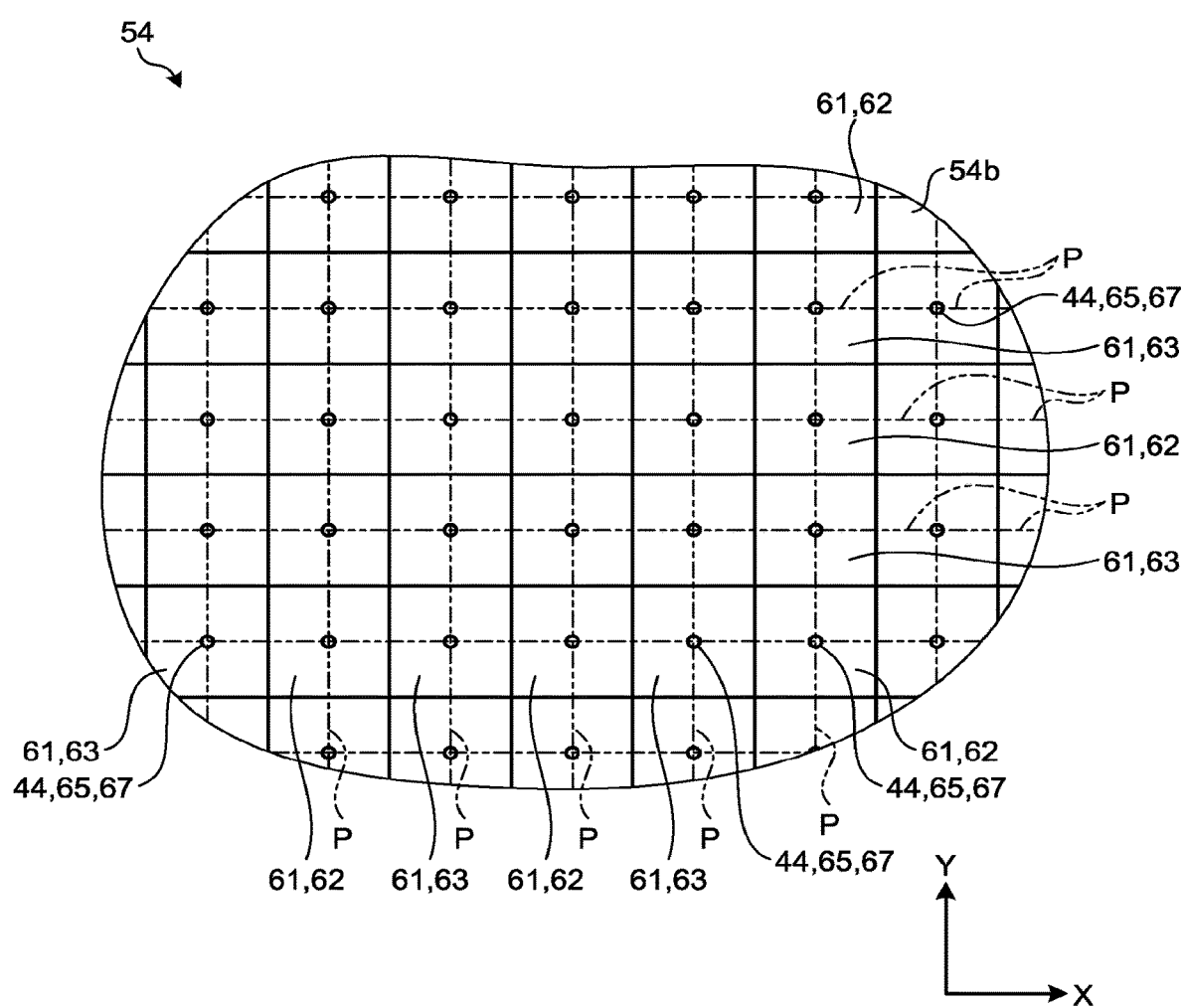
FIG. 5 is a plan view illustrating one partition wall in the first embodiment.

FIG. 5 is a plan view illustrating one partition wall 54 of the first embodiment. As illustrated in FIG. 5, in the first embodiment, the curved portion 61 is formed in a substantially quadrangular pyramid shape. That is, the end portion the convexly-curved portion 62 in the lower direction of and the end portion of the concavely-curved portion 63 of the upper direction are each formed in a substantially quadrangular shape.

The convexly-curved portions 62 and the concavely-curved portions 63 are arranged alternately in the direction along the X axis. Furthermore, the convexly-curved portions 62 and the concavely-curved portions 63 are arranged alternately in the direction along the Y axis. In planar view in the negative direction along the Z axis, the convexly-curved portions 62 and the concavely-curved portions 63 are arranged to fill the plane without spacing and without overlapping.

As illustrated in FIG. 2, each of the partition walls 54 including the convexly-curved portions 62 and the concavely-curved portions 63, in one cross-section in planar view in the direction along the Y axis, has a sinusoidal shape. In other words, the partition wall 54 has a shape that can be expressed by a periodic function. The partition wall 54 may have other shapes.

The convexly-curved portions 62 and the concavely-curved portions 63 of the partition wall 54A are, in the direction along the X axis, arranged at an interval LA. The direction along the X axis is one example of a second direction. The interval LA is one example of a first interval. The interval LA is a distance between the apex portions of two convexly-curved portions 62 of the partition wall 54A. The distance between the apex portions of two concavely-curved portions 63 of the partition wall 54A is also the interval LA. Furthermore, the convexly-curved portions 62 and the concavely-curved portions 63 of the partition wall 54A are, in the direction along the Y axis, arranged at the interval LA.

The convexly-curved portions 62 and the concavely-curved portions 63 of the partition wall 54B are, in the direction along the X axis, arranged at an interval LB. The interval LB is one example of the first interval and a second interval. The interval LB is a distance between the apex portions of two convexly-curved portions 62 of the partition wall 54B. The distance between the apex portions of two concavely-curved portions 63 of the partition wall 54B is also the interval LB. Furthermore, the convexly-curved portions 62 and the concavely-curved portions 63 of the partition wall 54B are, in the direction along the Y axis, arranged at the interval LB.

The convexly-curved portions 62 and the concavely-curved portions 63 of the partition wall 54C are, in the direction along the X axis, arranged at an interval LC. The interval LC is one example of the second interval. The interval LC is a distance between the apex portions of two convexly-curved portions 62 of the partition wall 54C. The distance between the apex portions of two concavely-curved portions 63 of the partition wall 54C is also the interval LC. Furthermore, the convexly-curved portions 62 and the concavely-curved portions 63 of the partition wall 54C are, in the direction along the Y axis, arranged at the interval LC.

In the first embodiment, the interval LB is an interval that is substantively twice the interval LA. That is, the interval LB is longer than the interval LA and has a common multiple with the interval LA. The interval LB may be another interval obtained by multiplying the interval LA by an integer multiple of two, for example. The interval LB may be the same interval as the interval LA or may be another interval.

The interval LC is an interval that is substantively twice the interval LB. That is, the interval LC is longer than the interval LB and has a common multiple with the interval LB. The interval LC may be another interval obtained by multiplying the interval LB by an integer multiple of two, for example. The interval LC may be the same interval as the interval LB or may be another interval.

As in the following expression, a magnification A of the intervals of the convexly-curved portion 62 and the concavely-curved portion 63 of the adjacent partition walls 54 becomes an integer M when multiplied by an integer N. The magnification A is one or greater.

$$A = M/N \ (M \geq N)$$

Moreover, the magnification A may not be increased at a fixed magnification. For example, the interval LB may be an interval that is twice the interval LA, and the interval LC may be an interval that is six times the interval LB.

On the shower plate 13, provided is a coupling portion 65 between the apex portion of at least one curved portion 61 and the wall 51 different from the wall 51 having the curved portion 61. The shower plate 13 includes a plurality of coupling portions 65.

The coupling portions 65 include a plurality of coupling portions 65A between the apex portions of the concavely-curved portions 63 of the partition wall 54A and the bottom wall 52. The coupling portions 65 include a plurality of coupling portions 65AB between the apex portions of the convexly-curved portions 62 of the partition wall 54A and the apex portions of the concavely-curved portions 63 of the partition wall 54B.

The coupling portions 65 include a plurality of coupling portions 65BC between the apex portions of the convexly-curved portions 62 of the partition wall 54B and the apex portions of the concavely-curved portions 63 of the partition wall 54C. The coupling portions 65 include a plurality of coupling portions 65C between the apex portions of the convexly-curved portions 62 of the partition wall 54C and the upper wall 53.

In the coupling portion 65, two walls 51 are integrally combined. In other words, the coupling portion 65 is a portion where two adjacent walls 51 are integrally formed. The coupling portion 65 may be a portion where two adjacent walls 51 are attached, bonded, or welded to each other, for example.

Figure 6:
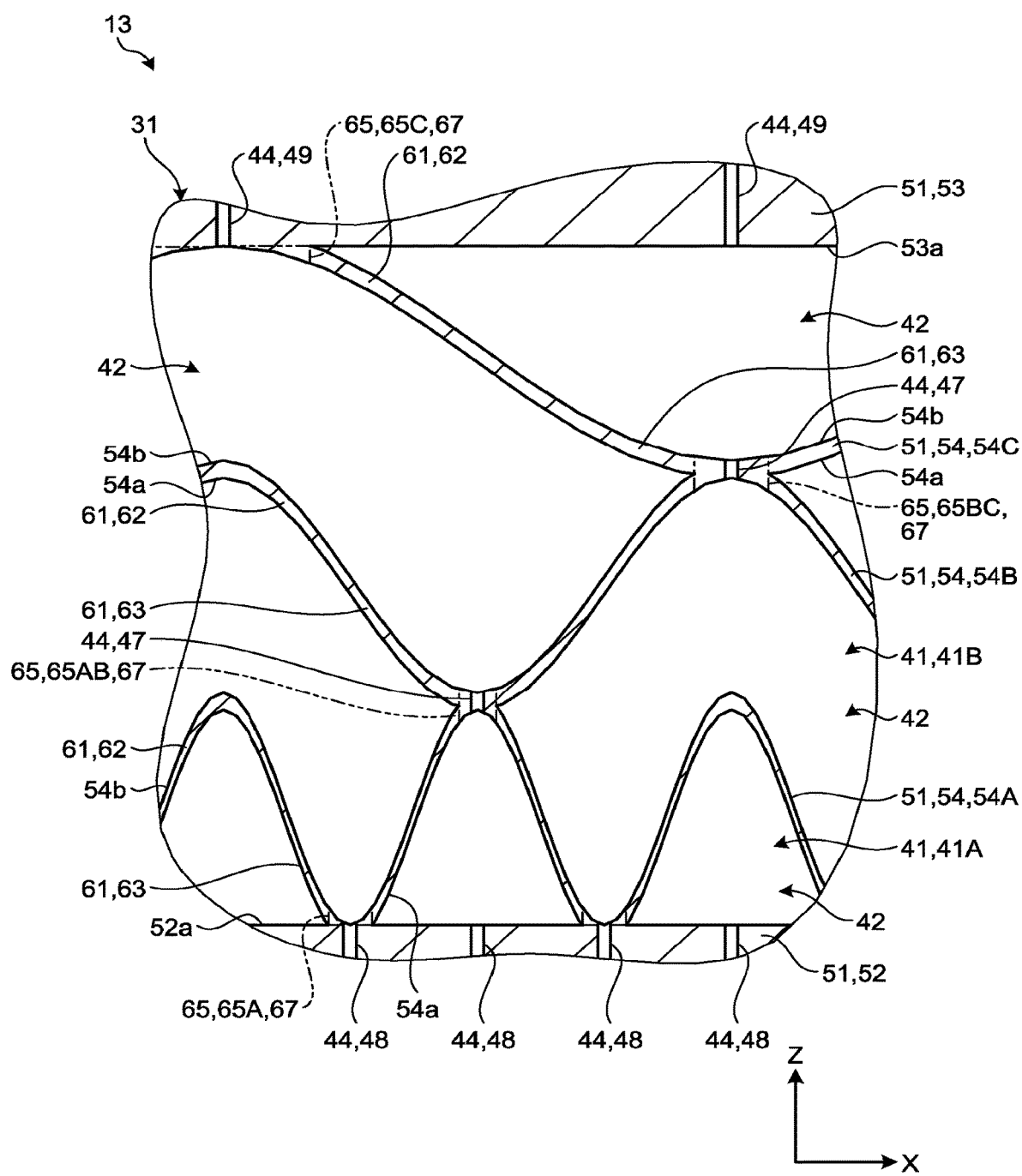
FIG. 6 is an enlarged cross-sectional view illustrating a part of the diffusion portion in the first embodiment.

FIG. 6 is an enlarged cross-sectional view illustrating a part of the diffusion portion 31 of the first embodiment. As illustrated in FIG. 6, in each of the coupling portions 65, a tube portion 67 is provided. The tube portion 67 is one example of a second wall portion, and can also be referred to as a pipe, an interposing portion, or a separation portion, for example. In FIG. 6, the coupling portions 65 and the tube portions 67 are indicated by long dashed double-dotted lines.

Each of the tube portions 67 is provided inside the shower plate 13, and separates the branch path 44 of one of the passages 41 and the fluid chamber 42 of the other of the passages 41. With different wording, the branch path 44 of one of the passages 41 is provided inside the tube portion 67, and the fluid chamber 42 of the other of the passages 41 is provided outside the tube portion 67.

For example, the tube portions 67 are provided in the coupling portions 65A between the bottom wall 52 and the apex portions of the concavely-curved portions 63 of the partition wall 54A. The bottom wall 52 and the partition wall 54A face one fluid chamber 42 of the passage 41A.

The tube portion 67 provided in the coupling portion 65A separates the fluid chamber 42 of the passage 41A and the outflow channel 48 of the passage 41B. The outflow channel 48 of the passage 41B provided in the coupling portion 65A opens to the upper surface 54b of the partition wall 54A. The outflow channel 48 of the passage 41B is further provided on the bottom wall 52 also, and couples the fluid chamber 42 with the outlet 43. Meanwhile, the outflow channel 48 of the passage 41A opens to the inner surface 52a of the bottom wall 52.

The tube portions 67 are provided in the coupling portions 65AB between several apex portions of the convexly-curved portions 62 of the partition wall 54A and the apex portions of the concavely-curved portions 63 of the partition wall 54B. The partition wall 54A and the partition wall 54B face one fluid chamber 42 of the passage 41B.

The tube portion 67 provided in the coupling portion 65AB separates the fluid chamber 42 of the passage 41B and the connecting channel 47 of the passage 41A. The connecting channel 47 of the passage 41A provided in the coupling portion 65AB opens to the lower surface 54a of the partition wall 54A and opens to the upper surface 54b of the partition wall 54B.

The tube portions 67 are provided in the coupling portions 65BC between several apex portions of the convexly-curved portions 62 of the partition wall 54B and the apex portions of the concavely-curved portions 63 of the partition wall 54C. The partition wall 54B and the partition wall 54C face one fluid chamber 42 of the passage 41A.

The tube portion 67 provided in the coupling portion 65BC separates the fluid chamber 42 of the passage 41A and the connecting channel 47 of the passage 41B. The connecting channel 47 of the passage 41B provided in the coupling portion 65BC opens to the lower surface 54a of the partition wall 54B and opens to the upper surface 54b of the partition wall 54C.

The tube portions 67 are provided in the coupling portions 65C between the apex portions of the convexly-curved portions 62 of the partition wall 54C and the upper wall 53. The partition wall 54C and the upper wall 53 face one fluid chamber 42 of the passage 41B.

The tube portion 67 provided in the coupling portion 65C separates the fluid chamber 42 of the passage 41B and the inflow channel 49 of the passage 41A. The inflow channel 49 of the passage 41A provided in the coupling portion 65C opens to the lower surface 54a of the partition wall 54C. The inflow channel 49 of the passage 41A is further provided in the upper wall 53. Meanwhile, the inflow channel 49 of the passage 41B opens to the inner surface 53a of the upper wall 53.

The number of the tube portions 67 and the branch paths 44 provided in the respective coupling portions 65 increases toward the negative direction along the Z axis. With different wording, in one passage 41, the number of the branch paths 44 opening to one fluid chamber 42 is greater than the number of the branch paths 44 opening to the other fluid chamber 42 farther away from the bottom surface 31a of the diffusion portion 31 than the one fluid chamber 42.

The number of the outflow channels 48 opening to the inner surface 52a of the bottom wall 52 is greater than the number of the connecting channels 47 opening to the lower surface 54a of the partition wall 54A, and is fourfold, for example. The inner surface 52a of the bottom wall 52 and the lower surface 54a of the partition wall 54A face one fluid chamber 42 of the passage 41A.

The number of the outflow channels 48 opening to the upper surface 54b of the partition wall 54A is greater than the number of the connecting channels 47 opening to the lower surface 54a of the partition wall 54B, and is fourfold, for example. The upper surface 54b of the partition wall 54A and the lower surface 54a of the partition wall 54B face one fluid chamber 42 of the passage 41B.

The number of the connecting channels 47 opening to the upper surface 54b of the partition wall 54B is greater than the number of the inflow channels 49 opening to the lower surface 54a of the partition wall 54C, and is fourfold, for example. The upper surface 54b of the partition wall 54B and the lower surface 54a of the partition wall 54C face one fluid chamber 42 of the passage 41A.

The number of the connecting channels 47 opening to the upper surface 54b of the partition wall 54C is greater than the number of the inflow channels 49 opening to the inner surface 53a of the upper wall 53, and is fourfold, for example. The upper surface 54b of the partition wall 54C and the inner surface 53a of the upper wall 53 face one fluid chamber 42 of the passage 41B.

The convexly-curved portions 62 of the partition wall 54A include the convexly-curved portions 62 that are not coupled to the concavely-curved portions 63 of the partition wall 54B and are spaced apart from the concavely-curved portions 63 of the partition wall 54B. At least one of the convexly-curved portions 62 of the partition wall 54A being spaced apart from the concavely-curved portions 63 of the partition wall 54B faces the coupling portion 65BC on which the tube portion 67 is provided. In other words, at least one of the convexly-curved portions 62 of the partition wall 54A being spaced apart from the concavely-curved portions 63 of the partition wall 54B is located in the lower direction of the coupling portion 65BC on which the tube portion 67 is provided.

The convexly-curved portions 62 of the partition wall 54B include the convexly-curved portions 62 that are not coupled to the concavely-curved portions 63 of the partition wall 54C and are spaced apart from the concavely-curved portions 63 of the partition wall 54C. At least one of the convexly-curved portions 62 of the partition wall 54B being spaced apart from the concavely-curved portions 63 of the partition wall 54C faces the coupling portion 65C on which the tube portion 67 is provided. In other words, at least one of the convexly-curved portions 62 of the partition wall 54B being spaced apart from the concavely-curved portions 63 of the partition wall 54B is located in the lower direction of the coupling portion 65C on which the tube portion 67 is provided.

As illustrated in FIG. 5, in each of the partition walls 54, in planar view in the negative direction along the Z axis, the apex portions of the curved portions 61 are arranged at the locations overlapping the apexes (vertex angles) of a plurality of regular polygons P that are arranged to fill the plane. In the first embodiment, the regular polygon P is a tetragon. With different wording, in planar view in the negative direction along the Z axis, the regular polygons P formed by the apexes of the curved portions 61 are arranged to fill the plane without spacing and without overlapping.

In each of the partition walls 54, in planar view in the negative direction along the Z axis, the coupling portions 65, the tube portions 67, and the branch paths 44 provided at the apex portions of the curved portions 61 are also arranged at the locations overlapping the apexes (vertex angles) of a plurality of regular polygons P that are arranged to fill the plane. Thus, in each of the partition walls 54, the apex portions, the coupling portions 65, the tube portions 67, and the branch paths 44 of the curved portions 61 are arranged at equal intervals.

The regular polygons P of the partition walls 54 are similar. For example, the regular polygons P of the partition wall 54A are tetragons larger than the regular polygons P of the partition wall 54B that are tetragons. The regular polygons P of the partition wall 54B are tetragons larger than the regular polygons P of the partition wall 54C that are tetragons.

As illustrated in FIG. 2, the length of each of the outflow channels 48 is longer than the length of each of the connecting channels 47. In the first embodiment, the inner diameter of the outflow channel 48 and the inner diameter of the connecting channel 47 are substantially identical. The inner diameter of the outflow channel 48 and the inner diameter of the connecting channel 47 may differ.

Figure 7:
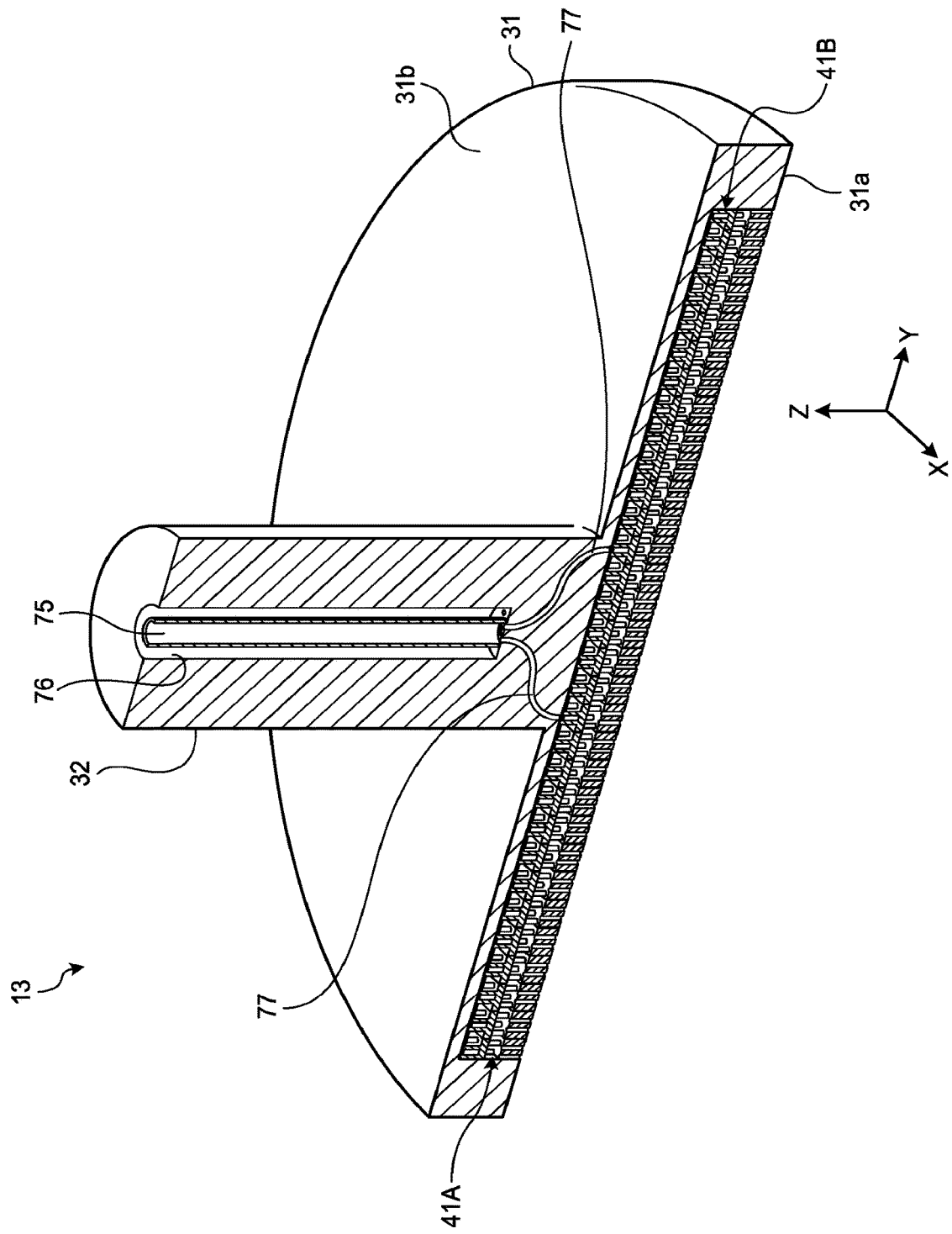
FIG. 7 is a perspective view roughly illustrating a cross-section of a shower plate in the first embodiment.
Figure 8:
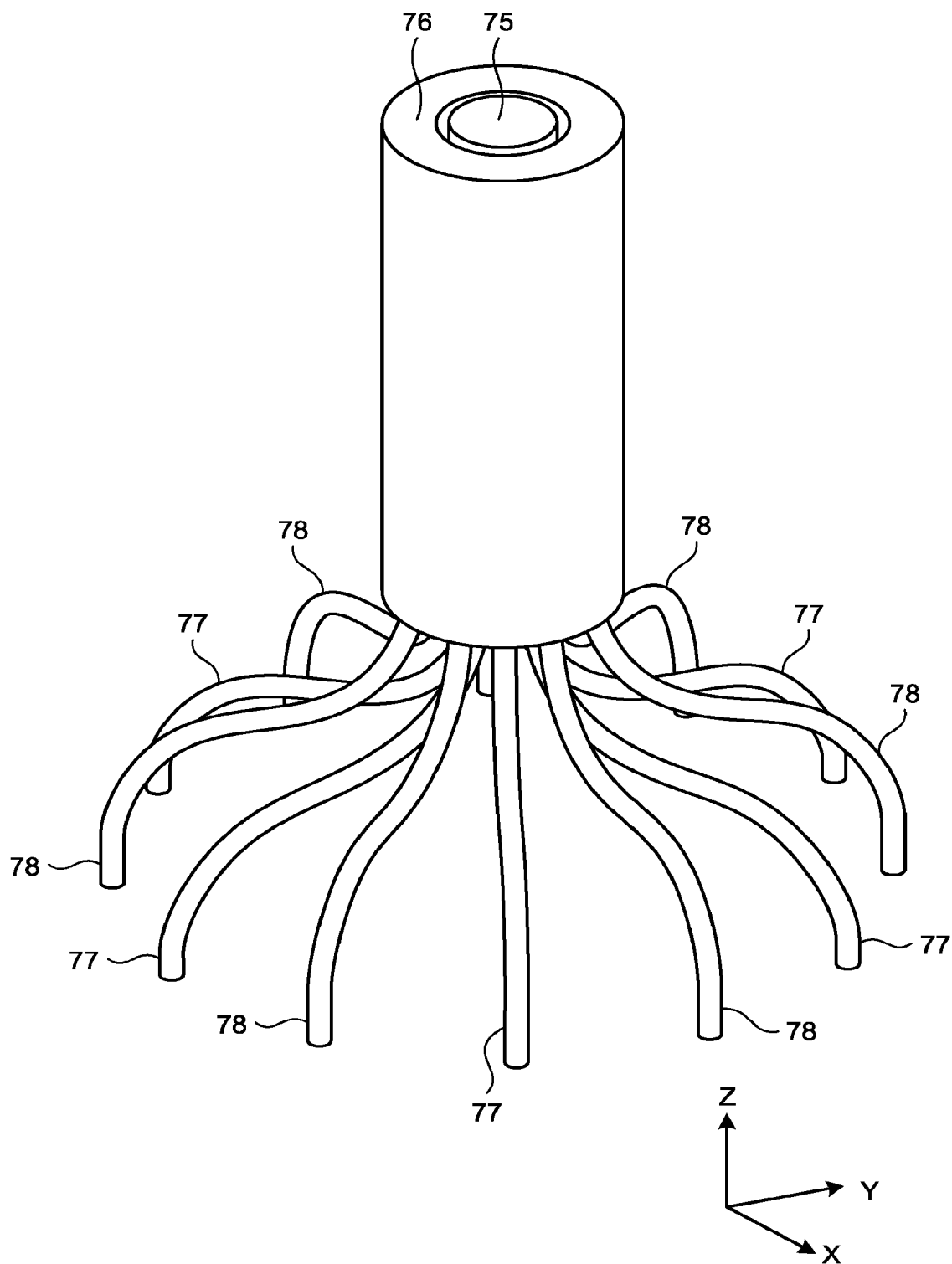
FIG. 8 is a perspective view illustrating a first tube line, a second tube line, a plurality of first distribution passages, and a plurality of second distribution passages in the first embodiment.

FIG. 7 is a perspective view roughly illustrating a cross-section of the shower plate 13 of the first embodiment. FIG. 8 is a perspective view illustrating a first tube line 75, a second tube line 76, a plurality of first distribution passages 77, and a plurality of second distribution passages 78 of the first embodiment.

As illustrated in FIGS. 7 and 8, on the shower plate 13, provided are the first tube line 75, the second tube line 76, the first distribution passages 77, and the second distribution passages 78 (illustrated in FIG. 8). FIG. 8 illustrates, omitting the tube portion 32, the first tube line 75, the second tube line 76, the first distribution passages 77, and the second distribution passages 78.

Each of the first tube line 75 and the second tube line 76 is provided in the tube portion 32 and extends in the direction along the Z axis. The second tube line 76 has an annular cross-section. The first tube line 75 is located inside the second tube line 76. That is, the first tube line 75 and the second tube line 76 are the so-called double pipe.

The one end portion of the first tube line 75 opens at the end portion in the upper direction of the tube portion 32. The other end portion of the first tube line 75 is, via the first distribution passages 77, coupled to the inflow channels 49 of the passage 41A. The first tube line 75 is coupled to one fluid chamber 42 of the passage 41A via the inflow channel 49 of the passage 41A.

The one end portion of the second tube line 76 opens at the end portion in the upper direction of the tube portion 32. The other end portion of the second tube line 76 is, via the second distribution passages 78, coupled to the inflow channels 49 of the passage 41B. The second tube line 76 is coupled to one fluid chamber 42 of the passage 41B via the inflow channel 49 of the passage 41B.

As illustrated in FIG. 1, the first pump 14 is coupled to the tube portion 32 of the shower plate 13 via pipes, for example. The first pump 14 feeds, through the first tube line 75 and the first distribution passages 77 illustrated in FIG. 8, a first gas G1 to the passage 41A. The first gas G1 is one example of a first fluid. The first fluid is not limited to gas, and may be liquid, for example.

The first gas G1 fed to the first tube line 75 from the first pump 14 is, through the first distribution passages 77 and the inflow channels 49, fed to one fluid chamber 42 of the passage 41A. The first gas G1 is fed to the fluid chamber 42 on the upside of the passage 41A illustrated in FIG. 2.

The branch paths 44 open to the fluid chamber 42. However, the cross-sectional area of the fluid chamber 42 is greater than the cross-sectional area of the branch path 44. Thus, the pressure loss of the first gas G1 flowing through the fluid chamber 42 is smaller than the pressure loss of the first gas G1 flowing through the branch path 44. Accordingly, the first gas G1 diffuses in the fluid chamber 42, and the fluid chamber 42 is filled therewith, before entering the connecting channel 47 that opens to the fluid chamber 42.

When the fluid chamber 42 on the upside is filled with the first gas G1, the first gas G1 passes through the connecting channels 47 and is fed to the fluid chamber 42 on the lower side. The first gas G1 diffuses in the fluid chamber 42, and the fluid chamber 42 is filled therewith, before entering the outflow channel 48 that opens to the fluid chamber 42.

When the fluid chamber 42 on the lower side is filled with the first gas G1, the first gas G1 passes through the outflow channels 48 and is discharged from the outlets 43 toward the wafer W supported by the stage 12. FIG. 1 schematically illustrates the first gas G1 discharged from the outlets 43 by arrows of thin line.

The second pump 15 is coupled to the tube portion 32 of the shower plate 13 via pipes, for example. The second pump 15 feeds, through the second tube line 76 and the second distribution passages 78 illustrated in FIG. 8, a second gas G2 to the passage 41B. The second gas G2 is one example of a second fluid. The second fluid is not limited to gas, and may be liquid, for example.

The second gas G2 fed to the second tube line 76 from the second pump 15 is, through the second distribution passages 78 and the inflow channels 49, fed to the fluid chamber 42 on the upside of the passage 41B illustrated in FIG. 2.

The branch paths 44 open to the fluid chamber 42. However, the cross-sectional area of the fluid chamber 42 is greater than the cross-sectional area of the branch path 44. Thus, the pressure loss of the second gas G2 flowing through the fluid chamber 42 is smaller than the pressure loss of the second gas G2 flowing through the branch path 44. Accordingly, the second gas G2 diffuses in the fluid chamber 42, and the fluid chamber 42 is filled therewith, before entering the connecting channel 47 that opens to the fluid chamber 42.

When the fluid chamber 42 on the upside is filled with the second gas G2, the second gas G2 passes through the connecting channels 47 and is fed to the fluid chamber 42 on the lower side. The second gas G2 diffuses in the fluid chamber 42, and the fluid chamber 42 is filled therewith, before entering the outflow channel 48 that opens to the fluid chamber 42.

When the fluid chamber 42 on the lower side is filled with the second gas G2, the second gas G2 passes through the outflow channels 48 and is discharged from the outlets 43 toward the wafer W supported by the stage 12. FIG. 1 schematically illustrates the second gas G2 discharged from the outlets 43 by arrows of long dashed double-dotted line.

The first gas G1 is methylsilane, for example. The second gas G2 is hydrogen peroxide, for example. The first gas G1 and the second gas G2 discharged from the shower plate 13 form, by chemical reaction, a silicon dioxide film on the wafer W. The first gas G1 and the second gas G2 may be other fluid. The first gas G1 and the second gas G2 may be the fluid having the identical composition. The first gas G1 and the second gas G2 may be fed to the passage 41A and the passage 41B, not via the first and the second tube lines 75 and 76, but from the lateral side of the shower plate 13, for example.

In the first embodiment, the shower plate 13 is laminate-molded by using a 3D printer, for example. Thus, the shower plate 13 is shaped as an integrated object. That is, the shower plate 13, the walls 51, and the tube portions 67 are integrally shaped. The shower plate 13, the walls 51, and the tube portions 67 may be shaped individually.

As in the foregoing, each of the partition walls 54 has a sinusoidal shape, in one cross-section in planar view in the direction along the Y axis. Such a partition wall 54 having no flat surface facing in the lower direction is easily laminate-molded by using a 3D printer. The shower plate 13 may be shaped in other methods.

In the semiconductor manufacturing apparatus 10 in the above-described first embodiment, the fluid chambers 42 of the two passages 41A and 41B are arranged alternately in the negative direction along the Z axis. Thus, when each of the two passages 41A and 41B includes the plurality of fluid chambers 42 as in the first embodiment, the length of the outflow channel 48 of the passage 41A and the length of the outflow channel 48 of the passage 41B are restrained from differing greatly. Accordingly, the unevenness in ejection of or suction of the gases G1 and G2 at the outlets 43 is curtailed. Furthermore, the fluid chambers 42 and the branch paths 44 of the two passages 41A and 41B can be efficiently arranged.

The tube portion 67 separates the branch path 44 of one of the passages 41 and the fluid chamber 42 of the other of the passages 41. Thus, the branch path 44 of the passage 41B does not detour around the fluid chamber 42 of the passage 41A, and the branch path 44 is restrained from being lengthened, for example.

Each of the two passages 41A and 41B includes the fluid chambers 42. For example, each of the two passages 41A and 41B, after diffusing the gas G1 or G2 in the upstream fluid chamber 42, can eject the gas G1 or G2 from the outlets 43, through numerous outflow channels 48 provided in the downstream fluid chambers 42. Accordingly, the unevenness in ejection of or suction of the gases G1 and G2 at the outlets 43 is curtailed.

The partition wall 54 includes at least one of the curved portions 61 each of which projects in the negative direction along the Z axis or projects in the positive direction along the Z axis. Thus, the strength of the partition wall 54 is increased, and the partition wall 54 can be made thinner. Accordingly, the shower plate 13 can be made to be low-profile and to be light in weight.

On the shower plate 13, provided are the coupling portions 65 between the apex portions of the curved portions 61 and the other wall 51. Thus, the rigidity and the strength of the shower plate 13 are increased.

At the coupling portion 65, the tube portion 67 is provided. Thus, the rigidity and the strength of the shower plate 13 are increased. Furthermore, because the tube portion 67 is provided at the coupling portion 65 that is a portion close to the other wall 51, the length of the branch path 44 is shortened, and thus the pressure loss in the branch path 44 is reduced and the conductance is increased. Moreover, in the fluid chamber 42 of one of the passages 41, providing a pipe-shaped tube portion 67 that couples two walls 51 spaced apart from each other is no longer needed, for example.

At the coupling portion 65 between at least one apex portion of the convexly-curved portions 62 and at least one apex portion of the concavely-curved portions 63, the tube portion 67 is provided. Thus, the rigidity and the strength of the shower plate 13 are increased. Moreover, because the convexly-curved portion 62 projecting in the positive direction along the Z axis and the concavely-curved portion 63 projecting in the negative direction along the Z axis are coupled, the fluid chamber 42 is formed wider in the direction along the Z axis. Accordingly, the pressure loss of the gases G1 and G2 in the fluid chamber 42 is reduced and the conductance is increased, and the gases G1 and G2 become easy to diffuse in the fluid chamber 42.

For example, the convexly-curved portions 62 of the partition wall 54A are arranged at the interval LA in the direction along the X axis and in the direction along the Y axis. The convexly-curved portions 62 and the concavely-curved portions 63 of the partition wall 54B are arranged at the interval LB in the direction along the X axis and in the direction along the Y axis. The interval LB is longer than the interval LA and has a common multiple with the interval LA. Alternatively, the interval LC of the concavely-curved portions 63 of the partition wall 54C is longer than the interval LB and has a common multiple with the interval LB. Thus, the number of the coupling portions 65 of the two walls 51 increases toward the negative direction along the Z axis. Accordingly, when the gas G1 or G2 is discharged from the outlets 43, each of the two passages 41 can, after diffusing the gas G1 or G2 in the upstream fluid chamber 42 having a smaller number of the coupling portions 65 and the branch paths 44, eject the gas G1 or G2 from the outlets 43 via the numerous outflow channels 48 provided in the downstream fluid chambers 42. Accordingly, the unevenness in ejection of or suction of the gases G1 and G2 at the outlets 43 is curtailed. The periodic function that can express the shape of two adjacent partition walls 54 may be of a different function form as long as the interval of the periodic function has a common multiple.

When the interval LB is the interval obtained by multiplying the interval LA by the integer multiple of two and the interval LC is the interval obtained by multiplying the interval LB by the integer multiple of two, the convexly-curved portions 62 projecting upward are provided under the coupling portions 65 at which the branch paths 44 and the tube portions 67 are provided. Thus, as indicated by the arrows in FIG. 2, the gases G1 and G2 jetted in the negative direction along the Z axis from the branch paths 44 collide with the convexly-curved portions 62 and are distributed substantially evenly. Accordingly, the flow separation of the gases G1 and G2 is restrained from occurring, and the gases G1 and G2 are restrained from stagnating in the fluid chamber 42.

At least one of the convexly-curved portions 62 being spaced apart from the concavely-curved portions 63 faces the coupling portion 65 of the convexly-curved portion 62 at which the tube portion 67 is provided. In other words, under the coupling portions 65 at which branch paths 44 and the tube portions 67 are provided, the convexly-curved portions 62 projecting upward are provided. Thus, as indicated by the arrows in FIG. 2, the gas G1 or G2 jetted in the negative direction along the Z axis from the branch paths 44 collides with the convexly-curved portions 62 and is distributed substantially evenly. Accordingly, the flow separation of the gases G1 and G2 is restrained from occurring, and the gases G1 and G2 are restrained from stagnating in the fluid chamber 42.

The convexly-curved portion 62 tapers toward the positive direction along the Z axis. Thus, as indicated by the arrows in FIG. 2, the gas G1 or G2, which is jetted in the negative direction along the Z axis from the branch paths 44 of the tube portions 67 provided in the coupling portions 65 between the convexly-curved portions 62 and the concavely-curved portions 63, flows along the convexly-curved portion 62. Accordingly, the flow separation of the gases G1 and G2 is restrained from occurring, and the gases G1 and G2 are restrained from stagnating in the fluid chamber 42.

The apex portions of the curved portions 61 are arranged at the locations overlapping the apexes of a plurality of regular polygons P that are arranged to fill the plane, in planar view in the negative direction along the Z axis. Thus, the branch paths 44 and the outlets 43 are arranged evenly, and the unevenness in ejection of or suction of the gases G1 and G2 at the outlets 43 is curtailed. Moreover, a more uniform silicon dioxide film is formed on the wafer W.

The number of the branch paths 44 opening to the upper surface 54b facing one fluid chamber 42 is greater than the number of the branch paths 44 opening to the lower surface 54a facing the one fluid chamber 42. Accordingly, when the gas G1 or G2 is discharged from the outlets 43, each of the two passages 41A and 41B can, after diffusing the gas G1 or G2 in the upstream fluid chamber 42 having a smaller number of the branch paths 44, eject the gas G1 or G2 from the outlets 43 via the numerous outflow channels 48 provided in the downstream fluid chambers 42. Accordingly, the unevenness in ejection of or suction of the gases G1 and G2 at the outlets 43 is curtailed.

The length of the outflow channel 48 coupling the outlet 43 and the fluid chamber 42 is longer than the length of the connecting channel 47 coupling two fluid chambers 42. The longer the branch path 44 is, the greater the pressure loss of the gases G1 and G2 passing through the branch path 44 is and the lower the conductance is. Thus, when the gas G1 or G2 is discharged from the outlet 43, the gas G1 or G2 diffuses in the fluid chamber 42 before entering the outflow channel 48 coupling the outlet 43 and the fluid chamber 42. Accordingly, each of the two passages 41A and 41B can, after diffusing the gas G1 or G2 in the fluid chamber 42, eject the gas G1 or G2 from the outlets 43 via the outflow channels 48. Accordingly, the unevenness in ejection of or suction of the gases G1 and G2 at the outlets 43 is curtailed.

For example, when the shower plate 13 is formed with a plurality of members, there is some possibility of leaking of the gases G1 and G2 from a gap between the members. Meanwhile, in the first embodiment, the shower plate 13, the walls 51, and the tube portions 67 are integrally shaped. Thus, the gases G1 and G2 are restrained from leaking out from the shower plate 13.

Figure 9:
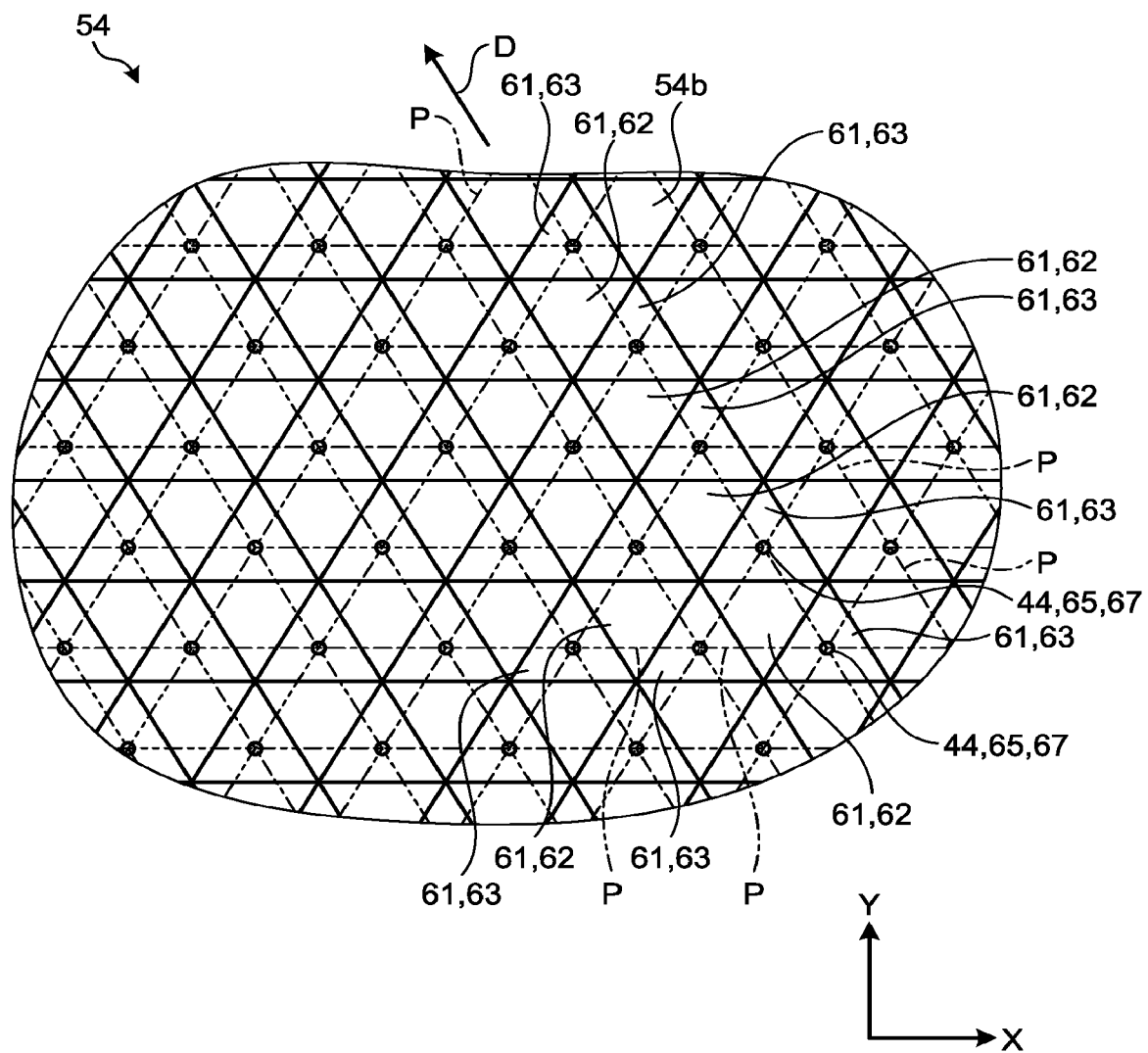
FIG. 9 is a plan view illustrating one partition wall according to a second embodiment.

The following describes a second embodiment with reference to FIG. 9. In the following description of a plurality of embodiments, the constituent elements having the same functions as those of the constituent elements already explained are denoted by the same reference signs of the already-described constituent elements, and the descriptions thereof may further be omitted. The constituent elements having the same reference sign do not necessarily have all the functions and characteristics in common, and may have different functions and characteristics in accordance with the respective embodiments.

FIG. 9 is a plan view illustrating one partition wall 54 according to the second embodiment. As illustrated in FIG. 9, in the second embodiment, the curved portion 61 is formed in a substantially triangular pyramid shape. That is, each of the end portion of the lower direction of the convexly-curved portion 62 and the end portion of the upper direction of the concavely-curved portion 63 is formed in a substantially triangular shape.

The convexly-curved portions 62 and the concavely-curved portions 63 are arranged alternately in the direction along the X axis. Furthermore, the convexly-curved portions 62 and the concavely-curved portions 63 are further arranged alternately in a direction D indicated by the arrow in FIG. 9. The direction D is one example of the second direction and is the direction that intersects with the X axis at 120 degrees. In planar view in the negative direction along the Z axis, the convexly-curved portions 62 and the concavely-curved portions 63 are arranged to fill the plane without spacing and without overlapping.

In each of the partition walls 54, in planar view in the negative direction along the Z axis, the apex portions, the coupling portions 65, the tube portions 67, and the branch paths 44 of the curved portions 61 are arranged at the locations overlapping the apexes (vertex angles) of a plurality of regular polygons P that are arranged to fill the plane. In the second embodiment, the regular polygon P is a triangle. Thus, in each of the partition walls 54, the apex portions, the coupling portions 65, the tube portions 67, and the branch paths 44 of the curved portions 61 are arranged at equal intervals.

As illustrated in the above-described second embodiment, the regular polygon P is not limited to a tetragon in the first embodiment, and may be other shapes such as a triangle in the second embodiment. Furthermore, the regular polygon P may include a plurality of shapes. For example, the regular polygon P may include a hexagon, a tetragon, and a triangle that form Archimedean tessellations. The regular polygon P may include other shapes.

Figure 10:
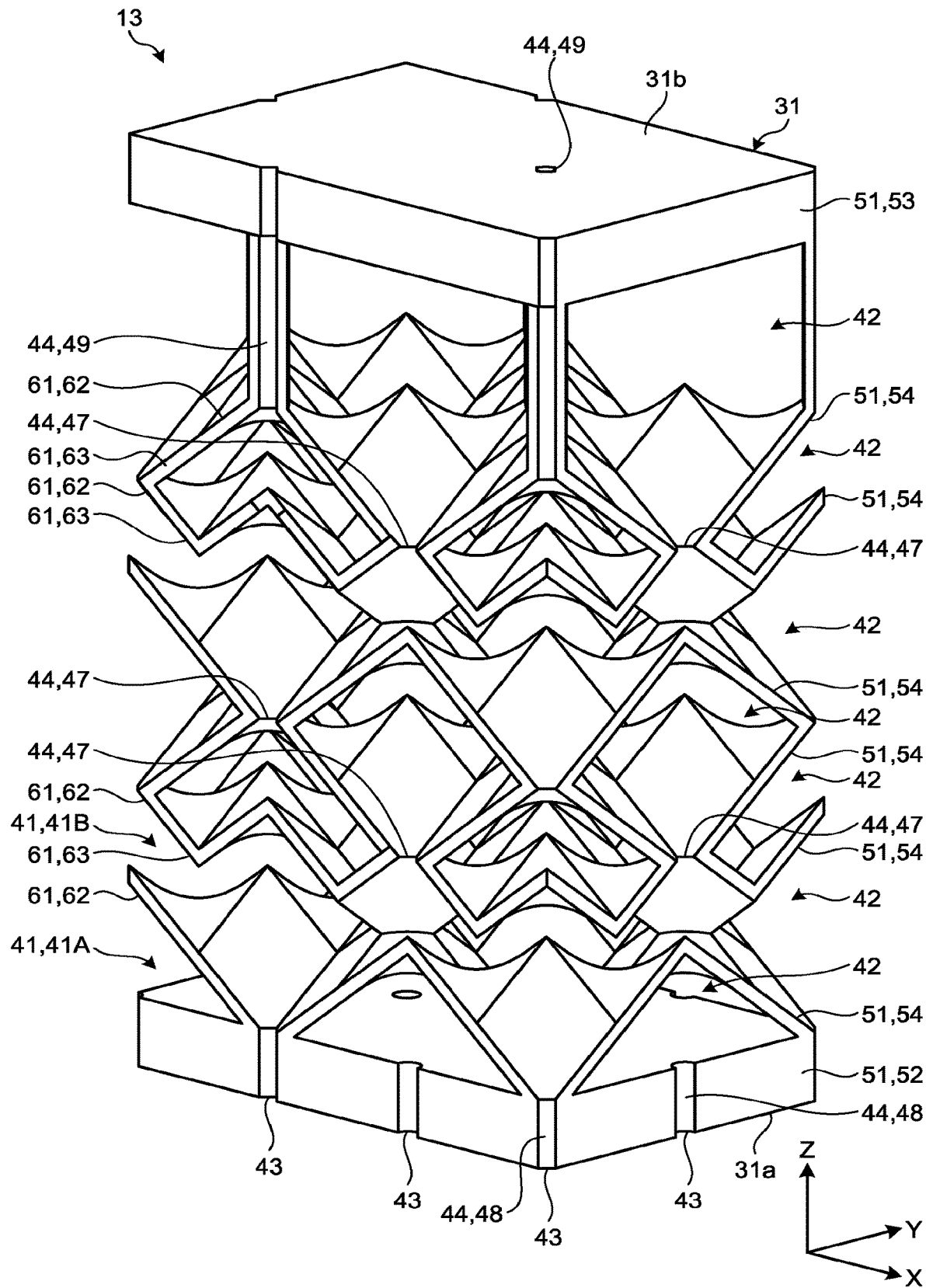
FIG. 10 is a perspective view illustrating a cross-section of a part of a diffusion portion according to a third embodiment.
Figure 11:
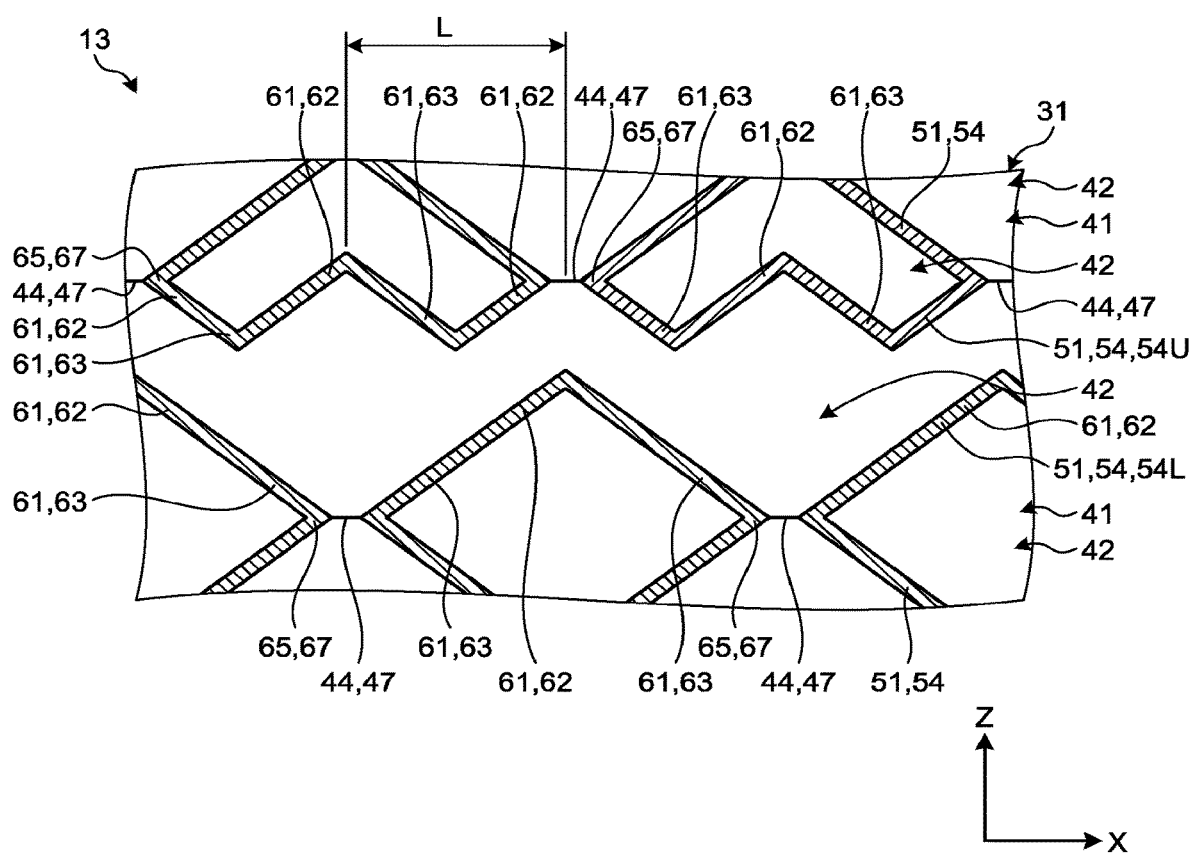
FIG. 11 is a cross-sectional view illustrating a part of the diffusion portion in the third embodiment.

The following describes a third embodiment with reference to FIGS. 10 and 11. FIG. 10 is a perspective view illustrating a cross-section of a part of the diffusion portion 31 according to the third embodiment. As illustrated in FIG. 10, the partition walls 54 in the third embodiment, although formed in periodically curved plate-like shapes, have a different shape from that of the partition walls 54 of the first embodiment. Furthermore, in the third embodiment, six partition walls 54 are provided inside the diffusion portion 31.

In the third embodiment, each of the convexly-curved portions 62 and the concavely-curved portions 63 included in the curved portions 61 is formed with two flat plate-like portions and two curved plate-like portions. The apex portion of the curved portion 61 is formed in a substantially quadrangular pyramid. The curved portion 61 may have other shapes.

In the third embodiment, the convexly-curved portions 62 include a plurality of convexly-curved portions 62 having different shapes from one another. That is, one partition wall 54 includes the convexly-curved portions 62 having one shape and the convexly-curved portion 62 having a different shape from the relevant convexly-curved portions 62.

As with the convexly-curved portions 62, the concavely-curved portions 63 include a plurality of concavely-curved portions 63 having different shapes from one another. That is, one partition wall 54 includes the concavely-curved portions 63 having one shape and the concavely-curved portions 63 having a different shape from the relevant concavely-curved portions 63.

The partition walls 54 including the above-described convexly-curved portions 62 and the concavely-curved portions 63 are formed in zigzags, in one cross-section in planar view in the direction along the Y axis. That is, the cross-sectional shape of the partition wall 54 is not limited to a continuously curved shape like the sinusoidal shape of the first embodiment, and may be formed in other shapes such as a zigzag shape of the third embodiment. The shape of the partition wall 54 of the third embodiment can also be expressed by a periodic function.

FIG. 11 is a cross-sectional view illustrating a part of the diffusion portion 31 of the third embodiment. As illustrated in FIG. 11, when paying attention to two partition walls 54 facing one fluid chamber 42, one that is located further in the negative direction along the Z axis than the other may be referred to as a partition wall 54L, and the other may be referred to as a partition wall 54U.

As illustrated in FIG. 11, when viewing a cross-section at a certain location of the shower plate 13 in planar view in the direction along the Y axis, the convexly-curved portions 62 and the concavely-curved portions 63 of one of the partition walls 54U and 54L (partition wall 54U, in FIG. 11) are arranged in the direction along the X axis at an interval L. The convexly-curved portions 62 and the concavely-curved portions 63 of the other of the partition walls 54U and 54L (partition wall 54L, in FIG. 11) are arranged in the direction along the X axis at an interval that is twice the interval L. When viewing a cross-section at other locations of the shower plate 13 in planar view in the direction along the Y axis, the intervals of the partition walls 54U and 54L are different from the above-described intervals.

At least one of the convexly-curved portions 62 of the partition wall 54L includes the convexly-curved portions 62 that are not coupled to the concavely-curved portions 63 of the partition wall 54U and are spaced apart from the concavely-curved portions 63 of the partition wall 54U. At least one of the convexly-curved portions 62 of the partition wall 54L being spaced apart from the concavely-curved portions 63 of the partition wall 54U faces the coupling portion 65 of the convexly-curved portion 62 of the partition wall 54U on which the tube portion 67 is provided.

As illustrated in the above-described third embodiment, the shape of the partition wall 54 is not limited to a simple periodic function such as a sine function of the first embodiment, and may be a shape that can be expressed by a complicated periodic function.

In the third embodiment, at least one of the convexly-curved portions 62 of the partition wall 54L being spaced apart from the concavely-curved portions 63 of the partition wall 54U faces the coupling portion 65 of the convexly-curved portion 62 on which the tube portion 67 of the partition wall 54U is provided. Thus, the gas G1 or G2 jetted in the negative direction along the Z axis from the branch paths 44 collides with the convexly-curved portions 62 of the partition wall 54L and is distributed substantially evenly. Accordingly, the flow separation of the gases G1 and G2 is restrained from occurring, and the gases G1 and G2 are restrained from stagnating in the fluid chambers 42.

Figure 12:
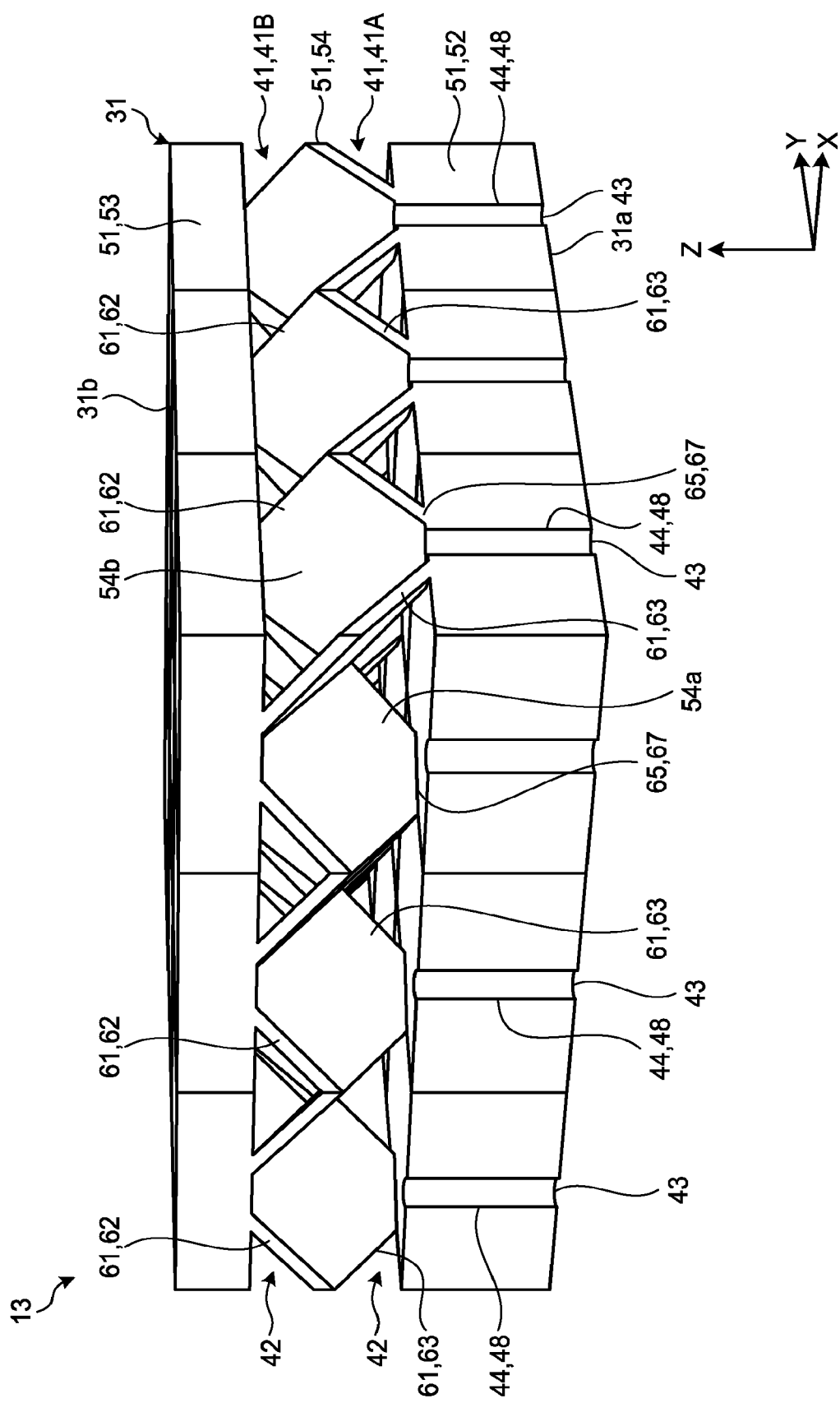
FIG. 12 is a perspective view illustrating a cross-section of a part of a diffusion portion according to a fourth embodiment.

The following describes a fourth embodiment with reference to FIG. 12. FIG. 12 is a perspective view illustrating a cross-section of a part of the diffusion portion 31 according to the fourth embodiment. As illustrated in FIG. 12, the partition wall 54 in the fourth embodiment, although formed in periodically bent plate-like shapes, has a different shape from that of the partition walls 54 of the first embodiment. Furthermore, in the fourth embodiment, one partition wall 54 is provided inside the diffusion portion 31.

In the fourth embodiment, each of the convexly-curved portions 62 and the concavely-curved portions 63 included in the curved portions 61 is formed with four flat plate-like portions. The apex portion of the curved portion 61 is formed in a substantially quadrangular pyramid. The curved portion 61 may have other shapes.

The partition walls 54 including the above-described convexly-curved portions 62 and the concavely-curved portions 63 are formed in zigzags, in one cross-section in planar view in the direction along the Y axis. The shape of the partition wall 54 of the fourth embodiment can also be expressed by a periodic function.

The tube portions 67 are provided at the coupling portions 65 between the apex portions of the convexly-curved portions 62 and the upper wall 53. The relevant tube portion 67 separates the inflow channel 49 of the passage 41A and the fluid chamber 42 of the passage 41B. The tube portions 67 are further provided in the coupling portions 65 between the apex portions of the concavely-curved portions 63 and the bottom wall 52. The relevant tube portion 67 separates the outflow channel 48 of the passage 41B and the fluid chamber 42 of the passage 41A.

In the fourth embodiment, the inner surface 52a of the bottom wall 52 and the lower surface 54a of the partition wall 54 face the fluid chamber 42 of the passage 41A. Furthermore, the upper surface 54b of the partition wall 54 and the inner surface 53a of the upper wall 53 face the fluid chamber 42 of the passage 41B. The fluid chamber 42 of the passage 41A and the fluid chamber 42 of the passage 41B are arranged at roughly identical locations in the direction along the Z axis.

In the semiconductor manufacturing apparatus 10 of the above-described fourth embodiment, the coupling portions 65 between the apex portions of the curved portions 61 and the other wall 51 is provided on the shower plate 13. Thus, the rigidity and the strength of the shower plate 13 are increased.

Moreover, the shape of the fluid chamber 42 of the passage 41A on one side is made substantially identical geometrically to the shape of the fluid chamber 42 of the passage 41B on the other side, and thus the pressure loss and the conductance of the first gas G1 in the fluid chamber 42 of the passage 41A on the one side can be made closer to the pressure loss and the conductance of the second gas G2 in the fluid chamber 42 of the passage 41B on the other side. Accordingly, the unevenness in ejection of or suction of the gases G1 and G2 at the outlets 43 is curtailed.

At the coupling portion 65, the tube portion 67 is provided. Thus, on the fluid chamber 42 of one of the passages 41, there is no need to provide a pipe-shaped tube portion 67 that couples two walls 51 spaced apart from each other, for example. Accordingly, the shape of the fluid chamber 42 of the passage 41A on the one side can be made substantially identical geometrically to the shape of the fluid chamber 42 of the passage 41B on the other side.

Figure 13:
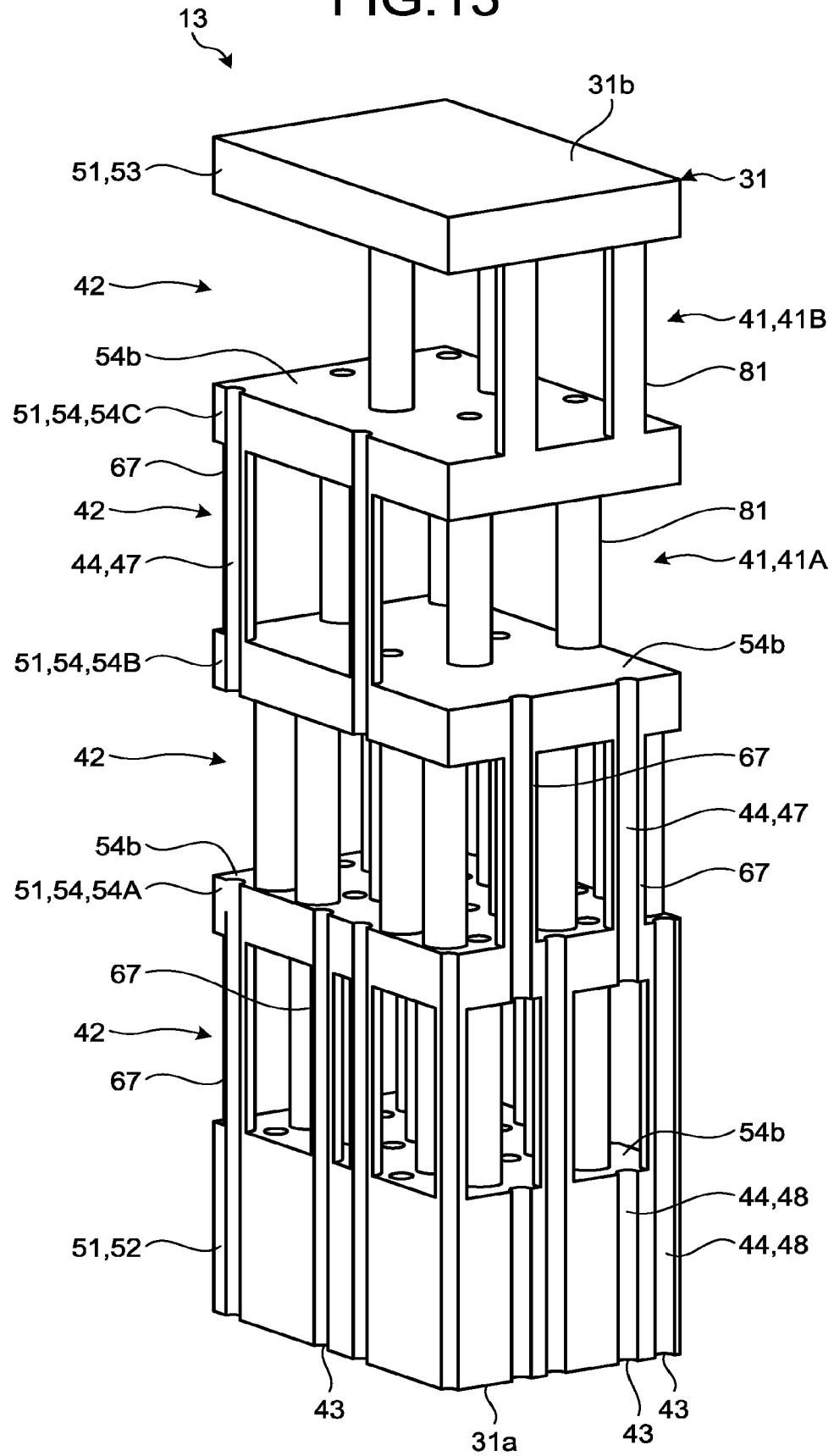
FIG. 13 is a perspective view illustrating a cross-section of a part of a diffusion portion according to a fifth embodiment.

The following describes a fifth embodiment with reference to FIG. 13. FIG. 13 is a perspective view illustrating a cross-section of a part of the diffusion portion 31 according to the fifth embodiment. As illustrated in FIG. 13, the partition walls 54 of the fifth embodiment are formed in a substantially flat plate-like shape. Thus, the lower surfaces 54a and the upper surfaces 54b of the partition walls 54 are formed substantially flat. Furthermore, in the fifth embodiment, three partition walls (54A, 54B, 54C) are provided inside the diffusion portion 31.

In the fifth embodiment, a plurality of walls 51 are arranged being spaced apart from one another in the negative direction along the Z axis. That is, the three partition walls 54A, 54B, and 54C are spaced apart from one another. The bottom wall 52 is spaced apart from the partition wall 54A. The upper wall 53 is spaced apart from the partition wall 54C.

The tube portions 67 of the fifth embodiment are each formed in a pipe-like shape extending in the negative direction along the Z axis and couples two walls 51 that are spaced apart from each other. Furthermore, in the fluid chamber 42, provided are columnar supports 81 extending in the negative direction along the Z axis and coupling two walls 51 that are spaced apart from each other. Thus, the two walls 51 being spaced apart from each other are supported by the tube portions 67 and the columnar supports 81 with each other.

As with the tube portions 67 in the first to the fourth embodiments, the tube portions 67 of the fifth embodiment separate the branch paths 44 of the passage 41A and the fluid chamber 42 of the passage 41B. The other tube portions 67 separate the branch paths 44 of the passage 41B and the fluid chamber 42 of the passage 41A.

In the semiconductor manufacturing apparatus 10 of the above-described fifth embodiment, the lower surface 54a and the upper surface 54b of the partition wall 54 are formed substantially flat. Accordingly, arranging diffusion plates that diffuse the gases G1 and G2 in the fluid chambers 42 is made easy, for example.

Figure 14:
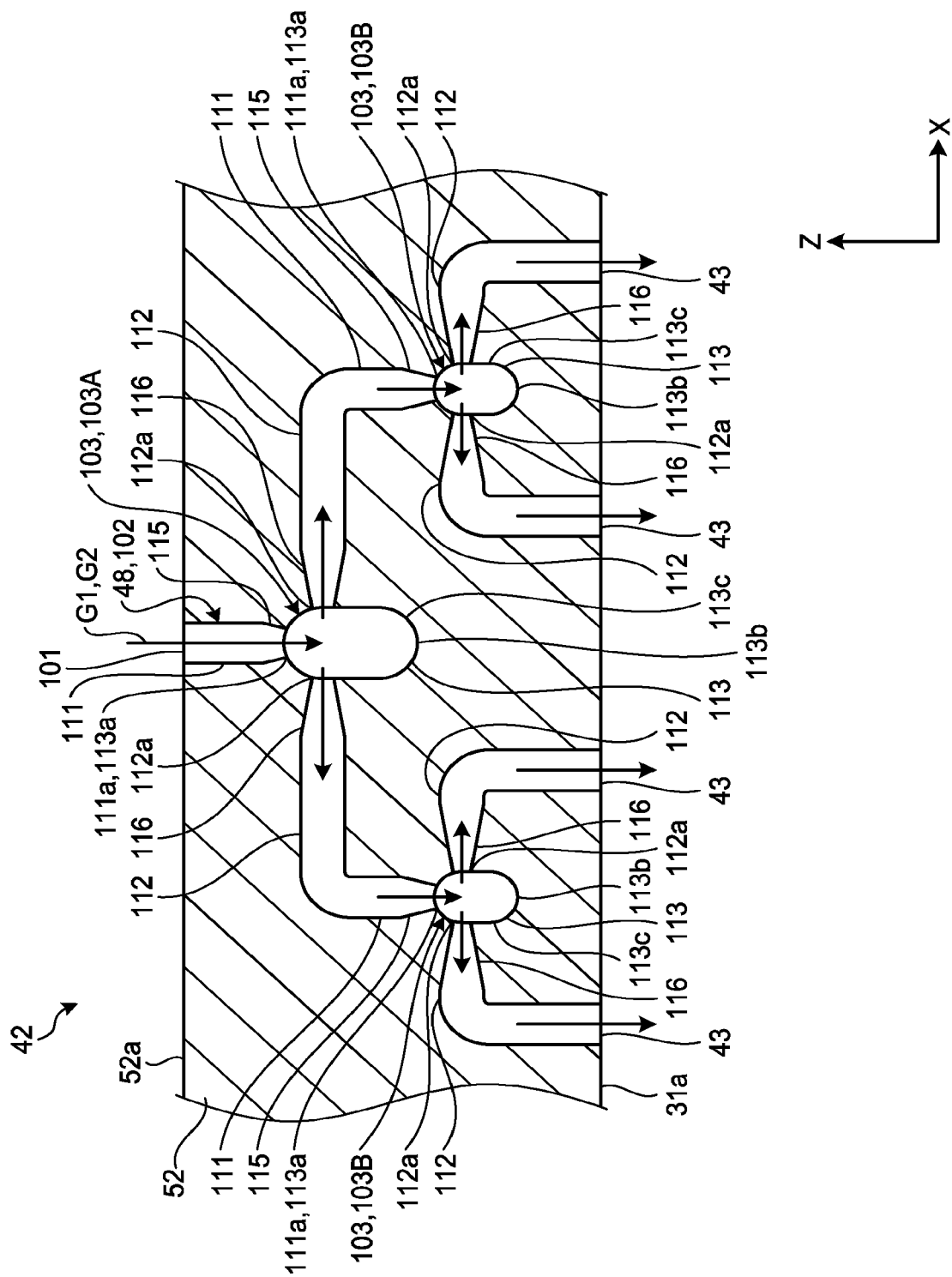
FIG. 14 is a cross-sectional view illustrating a part of a bottom wall according to a sixth embodiment.
Figure 15:
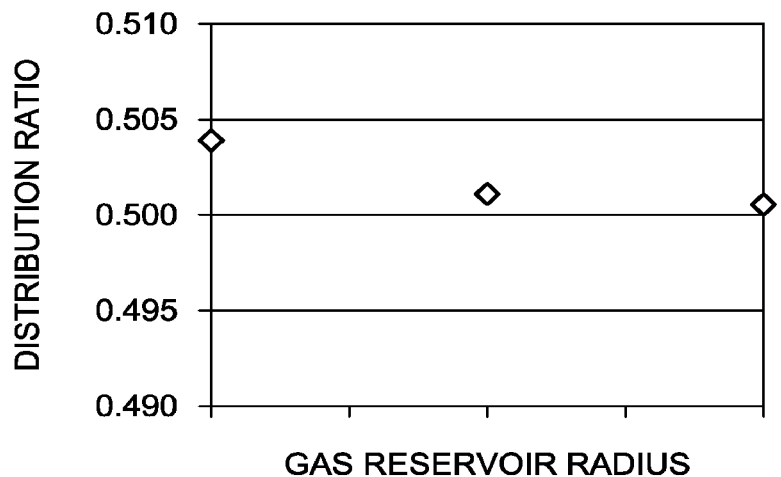
FIG. 15 is a chart illustrating a distribution ratio of gas toward a second extension path to the radius of a gas reservoir in the sixth embodiment.
Figure 16:
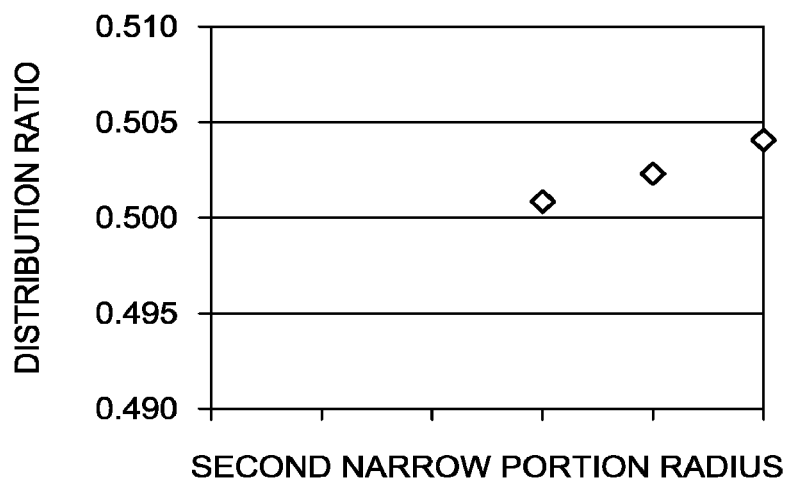
FIG. 16 is a chart illustrating the distribution ratio of the gas toward the second extension path to the minimum radius of a second narrow portion in the sixth embodiment.

The following describes a sixth embodiment with reference to FIGS. 14 to 16. FIG. 14 is a cross-sectional view illustrating a part of the bottom wall 52 according to the sixth embodiment. As illustrated in FIG. 14, the outflow channel 48 of the sixth embodiment is branched. Each of the outflow channels 48 includes an inner opening 101, a flow passage 102, and a plurality of branching portions 103.

The inner opening 101 opens to the inner surface 52a of the bottom wall 52. In other words, the inner opening 101 opens to the fluid chamber 42. The inner opening 101 is provided at the end of the outflow channel 48. With different wording, the inner opening 101 is formed by the edge of the inner surface 52a located at the end of the outflow channel 48.

The flow passage 102 couples the inner opening 101 opening to the fluid chamber 42 with at least two outlets 43. That is, at least two outlets 43 are coupled to one inner opening 101 via the flow passage 102.

The branching portions 103 are provided in the flow passage 102. In other words, the branching portions 103 are a part of the flow passage 102. Each of the branching portions 103 includes a first extension path 111, a plurality of second extension paths 112, and a gas reservoir 113. The first extension path 111 is one example of an upstream passage. The second extension path 112 is one example of a downstream passage. The gas reservoir 113 is one example of a cavity, and can also be referred to as a stagnation portion and a coupling portion, for example.

The first extension path 111 extends in the direction along the Z axis. The first extension path 111 may extend in other directions, or may extend in a curved shape. Each of the second extension paths 112 extends in a direction intersecting with the direction in which the first extension path 111 extends. In FIG. 14, the second extension paths 112 extend in the direction along the X axis. The second extension path 112 may extend in other directions such as the direction along the Y axis.

Each of the second extension paths 112 are, in the flow passage 102, closer to the outlet 43 than the first extension path 111. In other words, when the gas G1 or G2 flows from the inner opening 101 to the outlets 43, the first extension path 111 is located on the upstream side more than the second extension paths 112, and the second extension paths 112 are located on the downstream side more than the first extension path 111. Thus, the distance between the first extension path 111 and the outlet 43 may be shorter than the distance between the second extension path 112 and the outlet 43.

The first extension path 111 includes a first connection end portion 111a. The first connection end portion 111a is one end portion of the first extension path 111 in the direction along the Z axis. The first connection end portion 111a includes not only the end of the first extension path 111 but also a part of the first extension path 111 adjacent to the end.

Each of the second extension paths 112 includes a second connection end portion 112a. The second connection end portion 112a is one example of an end portion on the upstream side of each of the downstream passages. The second connection end portion 112a is one end portion of the second extension path 112 in the direction in which the second extension path 112 extends (direction along the X axis). The second connection end portion 112a includes not only the end of the second extension path 112 but also a part of the second extension path 112 adjacent to the end.

The gas reservoir 113 is located between the first extension path 111 and the second extension paths 112. The first extension path 111 and the second extension paths 112 are coupled to the gas reservoir 113. In other words, the first extension path 111 opens to the gas reservoir 113, and furthermore, each of the second extension paths 112 opens to the gas reservoir 113.

The first connection end portion 111a of the first extension path 111 is coupled to the gas reservoir 113. In other words, in the first connection end portion 111a, the first extension path 111 and the gas reservoir 113 are coupled.

Furthermore, the second connection end portion 112a of the second extension path 112 is coupled to the gas reservoir 113. In other words, in the second connection end portion 112a, the second extension path 112 and the gas reservoir 113 are coupled.

In the sixth embodiment, the gas reservoir 113 is formed in a substantially ellipsoidal shape or a prolate spheroid shape extending in the direction along the Z axis. The gas reservoir 113 may be formed in other shapes. The gas reservoir 113 includes a first end portion 113a and a second end portion 113b.

The first end portion 113a is one end portion of the gas reservoir 113 in the direction along the Z axis. The second end portion 113b is the other end portion of the gas reservoir 113 in the direction along the Z axis. That is, the second end portion 113b is on the opposite side of the first end portion 113a.

The first connection end portion 111a of the first extension path 111 is coupled to the first end portion 113a. The second connection end portion 112a of the second extension path 112 is, in the direction along the Z axis, coupled to the gas reservoir 113 at a location being spaced apart from the second end portion 113b.

The first extension path 111 is coupled to the second extension paths 112 via the gas reservoir 113. In other words, the second extension paths 112 are branched from one first extension path 111. The second extension paths 112 extend radially from the gas reservoir 113, for example.

The gas reservoir 113 includes a reservoir portion 113c. The reservoir portion 113c is a part of the gas reservoir 113, and is a portion between the second connection end portion 112a and the second end portion 113b in the direction along the Z axis.

The branching portion 103 further includes a first narrow portion 115 and a plurality of second narrow portions 116. The first narrow portion 115 is located at the first connection end portion 111a of the first extension path 111. In other words, the first narrow portion 115 is located between the first extension path 111 and the gas reservoir 113. In the sixth embodiment, in planar view in the direction along the Z axis, the cross-sectional area of the first narrow portion 115 is smaller than the cross-sectional areas of the other portions of the first extension path 111.

For example, the cross-sectional area of the first narrow portion 115 becomes smaller toward the gas reservoir 113. In other words, the first narrow portion 115 tapers toward the gas reservoir 113. The first narrow portion 115 may be a portion whose cross-sectional area is reduced by the wall projecting from the inner surface of the first extension path 111, for example. The branching portion 103 may include no first narrow portion 115. In other words, the cross-sectional area of the first extension path 111 may be constant.

The second narrow portion 116 is located at the second connection end portion 112a of each of the second extension paths 112. In other words, the second narrow portion 116 is located between the second extension path 112 and the gas reservoir 113. In the sixth embodiment, in planar view in the direction in which the second extension path 112 extends, the cross-sectional area of the second narrow portion 116 is smaller than the cross-sectional areas of the other portions of the second extension path 112.

For example, the cross-sectional area of the second narrow portion 116 becomes smaller toward the gas reservoir 113. In other words, the second narrow portion 116 tapers toward the gas reservoir 113. The second narrow portion 116 may be a portion whose cross-sectional area is reduced by a wall projecting from the inner surface of the second extension path 112, for example.

The second narrow portion 116 is, in the outflow channel 48, a portion whose cross-sectional area is smaller than the upstream section that is adjacent to the upstream of the second narrow portion 116. Thus, the cross-sectional area of the second narrow portion 116 and the cross-sectional area of the second extension path 112 may be the same.

The cross-sectional area of a portion where each of the second extension paths 112 and the gas reservoir 113 are coupled is smaller than the cross-sectional area of a portion where the first extension path 111 and the gas reservoir 113 are coupled. In other words, the minimum cross-sectional area of the second narrow portion 116 is smaller than the minimum cross-sectional area of the first narrow portion 115.

In planar view in the direction along the Z axis, the maximum cross-sectional area of the gas reservoir 113 is larger than the minimum cross-sectional area of the first narrow portion 115. Moreover, in the sixth embodiment, the maximum cross-sectional area of the gas reservoir 113 is larger than the maximum cross-sectional area of the first extension path 111. The maximum cross-sectional area of the gas reservoir 113 is not limited thereto.

As illustrated in FIG. 14, the outflow channel 48 of the sixth embodiment is branched off twice. In the following description, for the sake of explanation, the branching portions 103 may be referred to as a branching portion 103A and a branching portion 103B individually. The explanation common to the branching portions 103A and 103B is described as the explanation on the branching portion 103.

The branching portions 103 include one branching portion 103A and a plurality of branching portions 103B. The branching portion 103A is the branching portion 103 of the first layer and the branching portion 103B is the branching portion 103 of the second layer.

The first extension path 111 of the branching portion 103A is coupled to the inner opening 101. The second extension path 112 of the branching portion 103A and the first extension path 111 of the branching portion 103B are coupled to each other. The second extension path 112 of the branching portion 103B is coupled to the outlet 43.

The volume of the gas reservoir 113 of the branching portion 103A is larger than the volume of the gas reservoir 113 of the branching portion 103B. The minimum cross-sectional area of the second narrow portion 116 of the branching portion 103A is larger than the minimum cross-sectional area of the second narrow portion 116 of the branching portion 103B. The shapes of the branching portion 103A and the branching portion 103B are not limited thereto.

As illustrated by an arrow in FIG. 14, the first gas G1 or the second gas G2 (gas G1 or G2) flows into the outflow channel 48 from the inner opening 101. The gas G1 or G2, in the branching portion 103A, flows into the gas reservoir 113 from the first extension path 111.

The minimum cross-sectional area of the second narrow portion 116 is smaller than the maximum cross-sectional area of the gas reservoir 113. Thus, the gases G1 or G2 easily stays in the gas reservoir 113 rather than passing through the second narrow portion 116 and flowing into the second extension path 112. Thus, the gas G1 or G2 passes the second extension path 112 that opens to the gas reservoir 113, and flows toward the reservoir portion 113c of the gas reservoir 113. The gas G1 or G2, after having stayed in the gas reservoir 113, passes through the second narrow portions 116 and flows out to the second extension paths 112.

The gas G1 or G2 that flowed out to the second extension path 112 of the branching portion 103A, in the branching portion 103B, flows into the gas reservoir 113 from the first extension path 111. In the branching portion 103B also, the gas G1 or G2, after having stayed in the gas reservoir 113, passes through the second narrow portions 116 and flows out to the second extension paths 112. The gas G1 or G2 passes through the second extension paths 112 and is ejected from the outlets 43.

As in the foregoing, the gases G1 and G2 stay in the gas reservoir 113, before passing through the second narrow portions 116 and flowing out to the second extension paths 112. Thus, the flow rates of the gases G1 and G2 flowing into the second extension paths 112 are restrained from being uneven, due to the influence of the flow in the first extension path 111.

With reference to FIGS. 15 and 16, the following describes one example of the flows of the gases G1 and G2 in the branching portion 103 including the gas reservoir 113 and the second narrow portions 116. FIG. 15 is a chart illustrating a distribution ratio of the gases G1 and G2 toward the second extension path 112 to the radius of the gas reservoir 113 in the sixth embodiment. FIG. 16 is a chart illustrating the distribution ratio of the gases G1 and G2 toward the second extension path 112 to the minimum radius of the second narrow portion 116 in the sixth embodiment.

The charts in FIGS. 15 and 16 illustrate one example of the distribution ratio of the gases G1 and G2 toward the second extension path 112 in the following conditions:

The portion where the first extension path 111 and the gas reservoir 113 are coupled is formed in a substantially rectangular shape.

The branching portion 103 includes two second extension paths 112 extending in directions opposite to each other.

The portion where the second extension path 112 and the gas reservoir 113 are coupled is formed in a circular shape and has the same radius as that of the second extension path 112. In FIG. 16, the radius of the second extension path 112 is varied.

The gas reservoir 113 is formed in a columnar shape. In FIG. 15, the radius of the gas reservoir 113 is varied.

As illustrated in FIG. 15, the distribution ratio gets closer to 0.5 as the radius of the gas reservoir 113 (volume of the gas reservoir 113) becomes larger. When the distribution ratio is 0.5, the gas G1 or G2 flows to the two second extension paths 112 evenly. Thus, the gas G1 or G2 flows to the second extension paths 112 evenly as the volume of the gas reservoir 113 is larger.

As illustrated in FIG. 16, the distribution ratio gets closer to 0.5 as the minimum radius of the second narrow portion 116 (minimum cross-sectional area of the second narrow portion 116) becomes smaller. Thus, the gas G1 or G2 flows to the second extension paths 112 evenly as the minimum cross-sectional area of the second narrow portion 116 is smaller.

In the semiconductor manufacturing apparatus 10 of the above-described sixth embodiment, the outflow channel 48 includes the second narrow portions 116 located at the respective second connection end portions 112a of the second extension paths 112. This outflow channel 48 in the sixth embodiment can, as compared with when the second narrow portion 116 is not provided, reduce the unevenness due to the location in the velocity and pressure of the gases G1 and G2 on the upstream side of the second narrow portion 116. Accordingly, the unevenness of the flow rates of the gases G1 and G2 in the second narrow portions 116 and in the respective downstream sections that are adjacent to the downstream thereof is further reduced.

The outflow channel 48 includes the gas reservoir 113 as a cavity located between one first extension path 111 and the second extension paths 112. This outflow channel 48 in the sixth embodiment can, as compared with when the gas reservoir 113 is not provided, reduce the unevenness due to the location in the velocity and pressure of the gases G1 and G2 on the upstream side of the gas reservoir 113. Accordingly, the unevenness of the flow rates of the gases G1 and G2 in the gas reservoirs 113 and in the respective downstream sections that are adjacent to the downstream thereof is further reduced.

In the branching portion 103B on the downstream side, a portion where the gas reservoir 113 can be formed is small. However, the volume of the gas reservoir 113 of the branching portion 103B is smaller than the volume of the gas reservoir 113 of the branching portion 103A. Thus, the gas reservoir 113 of the branching portion 103B can be easily provided.

The flow velocity of the gas G1 or G2 in the branching portion 103B on the downstream side is slower than the flow velocity of the gas G1 or G2 in the branching portion 103A on the upstream side. However, the minimum cross-sectional area of the second narrow portion 116 of the branching portion 103B is smaller than the minimum cross-sectional area of the second narrow portion 116 of the branching portion 103A. Thus, the difference in pressure between the upstream side and the downstream side of the second narrow portion 116 is ensured, and the unevenness due to the location in the velocity and pressure of the gases G1 and G2 in the second narrow portion 116 on the upstream side can be reduced.

Figure 17:
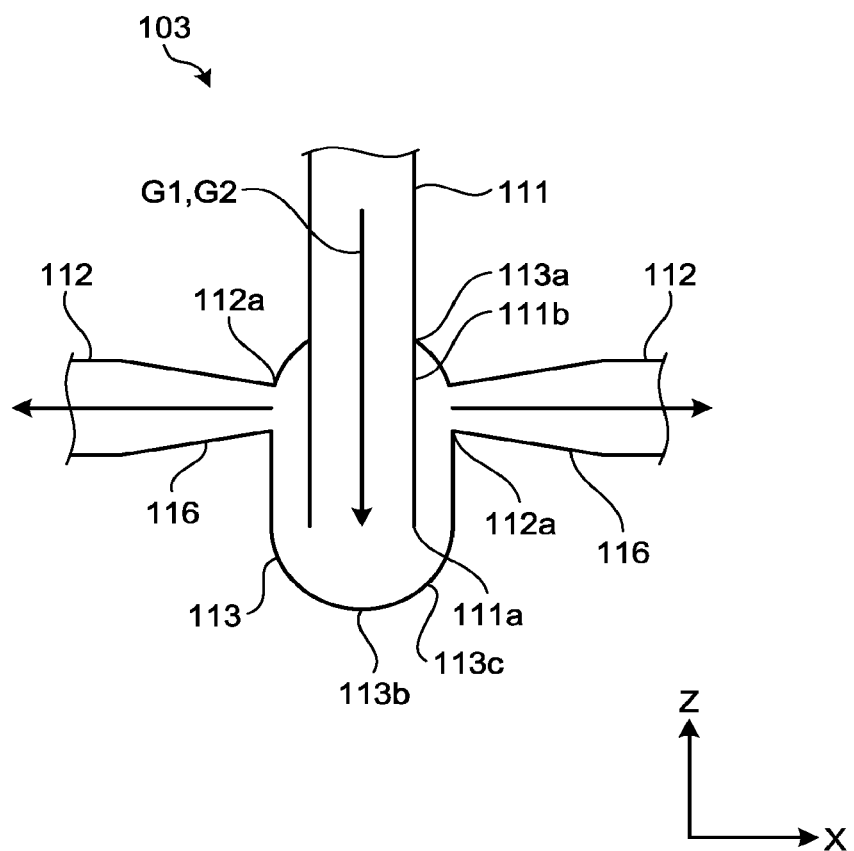
FIG. 17 is a diagram roughly illustrating a branching portion according to a modification of the sixth embodiment.

FIG. 17 is a diagram roughly illustrating the branching portion 103 according to a modification of the sixth embodiment. As illustrated in FIG. 17, the first extension path 111 may include an extending portion 111b. The extending portion 111b is a part of the first extension path 111 and extends toward the second end portion 113b from the first end portion 113a of the gas reservoir 113.

As the extending portion 111b is provided, the first extension path 111 opens to the gas reservoir 113 on the inside of the gas reservoir 113. The first extension path 111 opens to the gas reservoir 113 at a location closer to the second end portion 113b than the second extension paths 112. Thus, the flow rates of the gases G1 and G2 flowing into the second extension paths 112 are restrained from being uneven, due to the influence of the flow in the first extension path 111.

According to at least one of the above-described embodiments, each of the two passages includes at least one fluid chamber. The respective fluid chambers of the two passages are arranged alternately in the first direction. Thus, the unevenness in the ejection of or suction of fluid at the openings is curtailed.

While a number of embodiments of the invention have been exemplified in the foregoing, those embodiments are presented as mere examples and are not intended to limit the scope of the invention. Those novel embodiments described herein may be embodied in various other forms and, without departing from the scope of the invention, various omissions, substitutions, and modifications can be performed. Those embodiments and the modification thereof are included in the scope and spirit of the invention and are included in the scope of the invention stated in the appended claims and the scope of the equivalents thereof.

The invention claimed is:

1. A fluid passage structure comprising:
   a housing including an outer surface located at an end of a first direction and two passages separated from each other provided inside,
   each of the two passages including at least one fluid chamber, a plurality of openings that open to the outer surface, and a plurality of branch paths that are coupled to the fluid chamber,
   the fluid chamber of one of the two passages and the fluid chamber of the other of the two passages being arranged alternately in the first direction,
   the branch paths including at least one of: a plurality of branch paths coupling at least one of the openings with one fluid chamber; and a plurality of branch paths coupling one fluid chamber with another fluid chamber; and a plurality of first wall portions provided in the housing, facing the fluid chamber, and arranged in the first direction via the fluid chamber; and at least one second wall portion provided inside the housing and separating one of the branch paths of one of the passages and the fluid chamber of the other of the passages, wherein at least one of the first wall portions includes at least one curved portion projecting in the first direction or projecting in a direction opposite to the first direction.

2. The fluid passage structure according to claim 1, wherein each of the two passages includes a plurality of the fluid chambers.

3. The fluid passage structure according to claim 1, further comprising a coupling portion between an apex portion of the at least one curved portion and one of the first wall portions different from another of the first wall portions having the apex portion.

4. The fluid passage structure according to claim 3, wherein the second wall portion is provided at the coupling portion.

5. The fluid passage structure according to claim 4, wherein one of two of the first wall portions facing one fluid chamber located further in the first direction than the other includes a plurality of first curved portions that are included in the curved portion and project in the direction opposite to the first direction, the other of the two first wall portions facing the one fluid chamber includes a plurality of second curved portions that are included in the curved portion and project in the first direction, and the second wall portion is provided at the coupling portion between at least one apex portion of the first curved portions and at least one apex portion of the second curved portions.

6. The fluid passage structure according to claim 5, wherein the first curved portions are arranged at a first interval in a second direction intersecting with the first direction, and the second curved portions are arranged in the second direction at a second interval that is longer than the first interval and has a common multiple with the first interval.

7. The fluid passage structure according to claim 6, wherein the second interval is an interval obtained by multiplying the first interval by an integer multiple of two.

8. The fluid passage structure according to claim 5, wherein the at least one second wall portion includes a plurality of second wall portions, one of the first wall portions including the second curved portions includes a plurality of third curved portions projecting in the direction opposite to the first direction, one of the second wall portions is provided at the coupling portion between at least one apex portion of the third curved portions and another of the first wall portions located further in the direction opposite to the first direction than the one of the first wall portions including the second curved portions, and at least one of the first curved portions spaced apart from the second curved portions faces the coupling portion of the third curved portions provided with the one of second wall portions.

9. The fluid passage structure according to claim 5, wherein the first curved portions taper toward the direction opposite to the first direction.

10. The fluid passage structure according to claim 1, wherein, in planar view in the first direction, in each of the first wall portions including the curved portions, apex portions of the curved portions are arranged at locations overlapping apex portions of a plurality of regular polygons that are arranged to fill a plane.

11. The fluid passage structure according to claim 1, wherein one of two of the first wall portions facing one fluid chamber located further in the first direction than the other includes a first surface that faces the one fluid chamber and to which the branch paths open, the other of the two first wall portions facing the one fluid chamber includes a second surface that faces the one fluid chamber and to which the branch paths open, and number of the branch paths opening to the first surface is greater than number of the branch paths opening to the second surface.

12. The fluid passage structure according to claim 1, wherein a length of one of the branch paths that couples one of the openings with one fluid chamber is longer than a length of another of the branch paths that couples one fluid chamber with another fluid chamber.

13. The fluid passage structure according to claim 1, wherein the housing, the first wall portions, and the at least one second wall portion are integrally formed.

14. The fluid passage structure according to claim 1, wherein each of the branch paths that couples at least one of the openings with the fluid chamber includes one upstream passage, a plurality of downstream passages branched off from the one upstream passage, and a plurality of narrow portions located at end portions on an upstream side of the respective downstream passages.

15. The fluid passage structure according to claim 14, wherein each of the branch paths that couples at least one of the openings with the fluid chamber includes a cavity located between the one upstream passage and the downstream passages, each of the downstream passages opens to the cavity, and the narrow portions are located between the cavity and the downstream passage.

16. A processing apparatus comprising:

the fluid passage structure according to claim 1;

an object supporting portion configured to support an object at a location to which the outer surface faces;

a first fluid feeding unit configured to feed a first fluid to one of the passages; and a second fluid feeding unit configured to feed a second fluid to the other of the passages.

* * * * *